(12) United States Patent
Kitami et al.

(10) Patent No.: US 10,461,716 B2
(45) Date of Patent: Oct. 29, 2019

(54) LOW-PASS FILTER

(71) Applicant: TDK CORPORATION, Tokyo (JP)

(72) Inventors: Manabu Kitami, Tokyo (JP); Noriyuki Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/956,943

(22) Filed: Apr. 19, 2018

(65) Prior Publication Data

US 2018/0316330 A1 Nov. 1, 2018

(30) Foreign Application Priority Data

Apr. 26, 2017 (JP) .................................. 2017-087621

(51) Int. Cl.
| | |
|---|---|
| *H03H 7/01* | (2006.01) |
| *H03H 1/00* | (2006.01) |
| *H01F 27/28* | (2006.01) |
| *H01F 27/40* | (2006.01) |
| *H01F 17/00* | (2006.01) |
| *H01G 4/40* | (2006.01) |
| *H01G 4/30* | (2006.01) |

(52) U.S. Cl.
CPC ....... *H03H 7/0115* (2013.01); *H01F 17/0013* (2013.01); *H01F 27/2804* (2013.01); *H01F 27/40* (2013.01); *H03H 1/00* (2013.01); *H03H 7/1708* (2013.01); *H03H 7/1758* (2013.01); *H03H 7/1766* (2013.01); *H01F 2017/0026* (2013.01); *H01F 2027/2809* (2013.01); *H01G 4/30* (2013.01); *H01G 4/40* (2013.01); *H03H 2001/0085* (2013.01)

(58) Field of Classification Search
CPC ......... H03H 2001/0085; H03H 7/0115; H03H 7/1766; H03H 7/1758
USPC .................................................. 333/175, 185
See application file for complete search history.

(56) References Cited

U.S. PATENT DOCUMENTS

| | | | | |
|---|---|---|---|---|
| 2009/0189714 A1* | 7/2009 | Sakisaka | ............... | H03H 7/0115 333/185 |
| 2012/0249264 A1* | 10/2012 | Wakata | ............... | H01P 1/20345 333/185 |
| 2017/0170798 A1 | 6/2017 | Masuda | | |

* cited by examiner

*Primary Examiner* — Rakesh B Patel
(74) *Attorney, Agent, or Firm* — Oliff PLC

(57) ABSTRACT

A low-pass filter includes first and second input/output ports, first and second LC parallel resonators connected in series and provided between the first and second input/output ports, and first to third paths. The first path includes a first LC series resonator and connects a first end of the first LC parallel resonator closest to the first input/output port to a ground. The second path includes a second LC series resonator and connects a second end of the second LC parallel resonator closest to the second input/output port to the ground. The third path includes a third-path capacitor and connects a connection point between the first and second LC parallel resonators to the ground.

5 Claims, 16 Drawing Sheets

LOW-PASS FILTER

BACKGROUND OF THE INVENTION

1. Field of the Invention

The present invention relates to a low-pass filter composed of an LC filter.

2. Description of the Related Art

Low-pass filters are one of electronic components used in communication apparatuses. Among known low-pass filters is one that is composed of an LC filter formed using an inductor and a capacitor.

For example, the following three performance characteristics are demanded of low-pass filters: first, sufficiently small insertion loss and sufficiently high return loss in the pass band; second, sufficiently high insertion loss in the stop band; and third, an abrupt increase in insertion loss with an increase in frequency in a frequency region within the stop band near the cut-off frequency.

A low-pass filter having such a characteristic that the frequency characteristic of the insertion loss forms one or more attenuation poles in the stop band is known to be capable of achieving the aforementioned first to third performance characteristics. Such a low-pass filter is disclosed in, for example, US 2017/0170798 A1.

The low-pass filter disclosed in US 2017/0170798 A1 includes first and second input/output terminals, first and second LC parallel resonators, first to third capacitors, and an inductor. The first and second LC parallel resonators are connected in series and provided between the first and second input/output terminals. One end of the first capacitor is connected to the first input/output terminal. One end of the second capacitor is connected to the second input/output terminal. One end of the third capacitor is connected to the connection point between the first and second LC parallel resonators. One end of the inductor is connected to the other end of each of the first to third capacitors. The other end of the inductor is connected to the ground.

An example of specific performance characteristics demanded of low-pass filters is that the return loss in a first frequency band within the pass band be not less than a first value while the insertion loss in a second frequency band within the stop band be not less than a second value.

In general, when adjusting the characteristics of a low-pass filter composed of an LC filter to satisfy requirements for certain performance characteristics, the inductance(s) of one or more inductors and/or the capacitance(s) of one or more capacitors may be adjusted.

To adjust the characteristics of the low-pass filter disclosed in US 2017/0170798 A1 to satisfy requirements for certain performance characteristics, the capacitance(s) of at least one of the first to third capacitors may be adjusted, for example.

In the low-pass filter disclosed in US 2017/0170798 A1, changing the capacitance(s) of at least one of the first to third capacitors would cause the frequency characteristic of the insertion loss in the stop band (hereinafter referred to as attenuation characteristic) and the frequency characteristic of the return loss in the pass band (hereinafter referred to as reflection characteristic) to change simultaneously. For this low-pass filter, it is thus difficult to adjust the characteristics to satisfy requirements for certain performance characteristics.

SUMMARY OF THE INVENTION

It is an object of the present invention to provide a low-pass filter whose characteristics are easily adjustable.

A low-pass filter of the present invention includes: a first input/output port; a second input/output port; a first LC parallel resonator and a second LC parallel resonator connected in series and provided between the first input/output port and the second input/output port; a first path; a second path; and a third path.

The first LC parallel resonator has a first end that is closest to the first input/output port in circuit configuration. The second LC parallel resonator has a second end that is closest to the second input/output port in circuit configuration. The first path includes a first LC series resonator and connects the first end to the ground. The second path includes a second LC series resonator and connects the second end to the ground. The third path includes a third-path capacitor and connects a connection point between the first and second LC parallel resonators to the ground. The third path has an inductance lower than an inductance of each of the first path and the second path.

In the low-pass filter of the present invention, the inductance of the third path may be 30% or less of the inductance of the first path and 30% or less of the inductance of the second path.

In the low-pass filter of the present invention, the first LC series resonator and the second LC series resonator may include a common inductor or a common capacitor.

The low-pass filter of the present invention may further include a multilayer stack for integrating the first and second input/output ports, the first and second LC parallel resonators and the first to third paths, the multilayer stack including a plurality of dielectric layers stacked to be aligned in a first direction.

The multilayer stack may have a first end face and a second end face located at opposite ends in the first direction. The low-pass filter may further include a ground terminal provided on the first end face and connected to the third path. A physical connection corresponding to the aforementioned connection point, the third-path capacitor, and the ground terminal may be arranged to intersect or contact one imaginary straight line extending in the first direction.

The third-path capacitor may include a first conductor layer and a second conductor layer located at different positions in the first direction and opposed to each other. The physical connection corresponding to the aforementioned connection point may lie in the second conductor layer. The third path may further include a ground through hole having one end connected to the first conductor layer and the other end connected to the ground terminal.

The first LC series resonator may include a first-path capacitor. The second LC series resonator may include a second-path capacitor. The first LC series resonator and the second LC series resonator may include a common inductor conductor layer connecting the first- and second-path capacitors to the one end of the ground through hole.

According to the low-pass filter of the present invention, changing the capacitance of the third-path capacitor enables changing the reflection characteristic without substantially changing the attenuation characteristic. The low-pass filter of the present invention thus facilitates characteristic adjustments.

Other and further objects, features and advantages of the invention will appear more fully from the following description.

DETAILED DESCRIPTION OF THE PREFERRED EMBODIMENT

Figure 1:
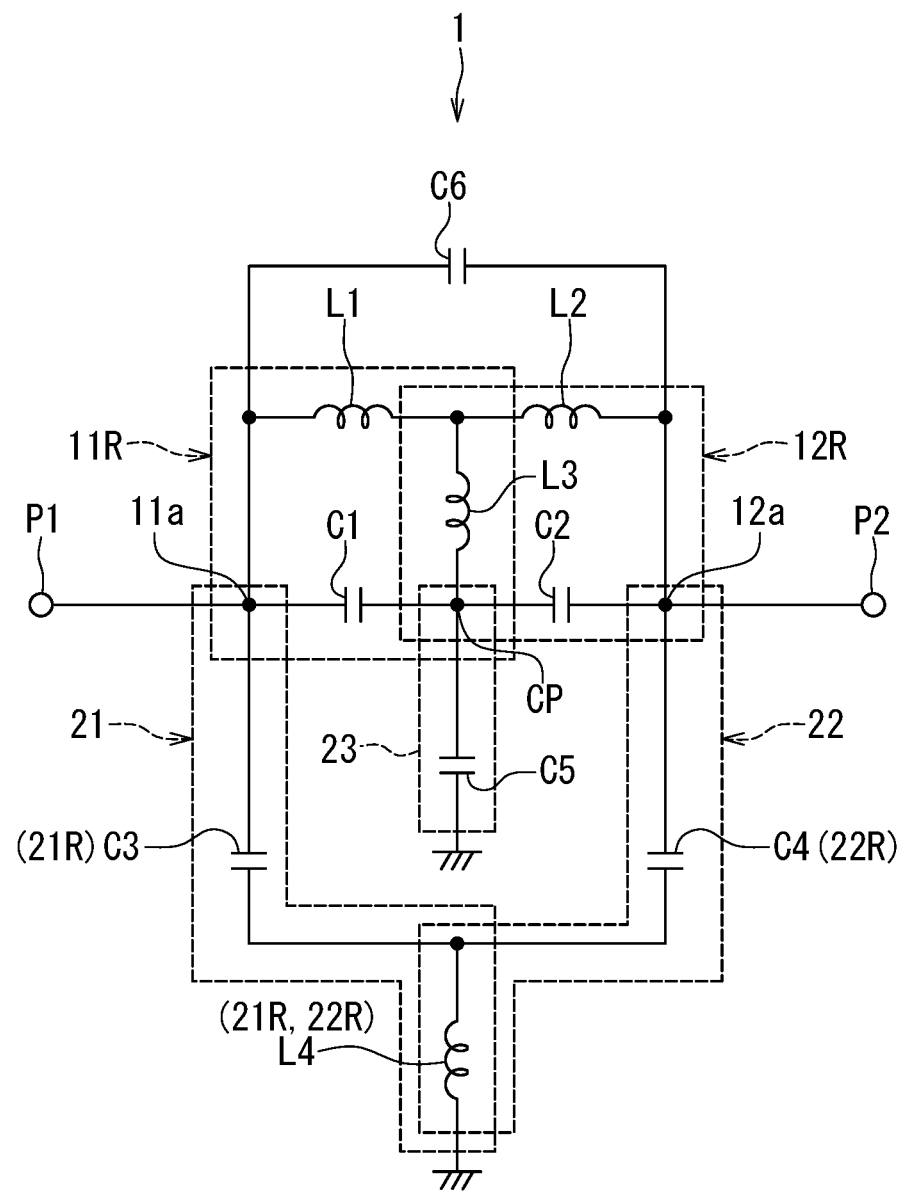
FIG. 1 is a circuit diagram illustrating an example circuit configuration of a low-pass filter according to an embodiment of the invention.

A preferred embodiment of the present invention will now be described in detail with reference to the drawings. FIG. 1 is a circuit diagram illustrating an example circuit configuration of a low-pass filter according to one embodiment of the present invention.

As shown in FIG. 1, the low-pass filter 1 according to the present embodiment includes a first input/output port P1, a second input/output port P2, a first LC parallel resonator 11R, a second LC parallel resonator 12R, a first path 21, a second path 22, and a third path 23. The first LC parallel resonator 11R and the second LC parallel resonator 12R are connected in series and provided between the first input/output port P1 and the second input/output port P2.

The first LC parallel resonator 11R has a first end 11a that is closest to the first input/output port P1 in circuit configuration. The second LC parallel resonator 12R has a second end 12a that is closest to the second input/output port P2 in circuit configuration. As used herein, the phrase "in circuit configuration" is to describe layout in a circuit diagram, not in a physical configuration.

The first path 21 includes a first LC series resonator 21R and connects the first end 11a to the ground. The second path 22 includes a second LC series resonator 22R and connects the second end 12a to the ground.

Each of the first and second LC series resonators 21R and 22R includes an inductor and a capacitor connected in series. The first and second LC series resonators 21R and 22R may include a common inductor or a common capacitor.

The third path 23 includes a third-path capacitor C5 and connects a connection point CP between the first and second LC parallel resonators 11R and 12R to the ground. The third path 23 has an inductance lower than that of each of the first path 21 and the second path 22.

The inductance of the third path 23 is preferably 30% or less of the inductance of the first path 21 and 30% or less of the inductance of the second path 22. The third path 23 preferably has the lowest possible inductance, which is ideally zero. Accordingly, in the present embodiment, no inductor is intentionally provided in the third path. Nevertheless, in the actual low-pass filter 1, the third path 23 has a slight inductance due to a self-inductance of the capacitor C5 and inductance(s) of conductor(s) connected to the capacitor C5. Even in such a case, the inductance of the third path 23 is unquestionably lower than the inductances of the first and second paths 21 and 22 which include respective inductors.

FIG. 1 illustrates a specific example of circuit configuration of the low-pass filter 1. This example will be described below.

The first LC parallel resonator 11R includes an inductor L1 and a capacitor C1. The second LC parallel resonator 12R includes an inductor L2 and a capacitor C2. The first and second LC parallel resonators 11R and 12R include a common inductor L3.

One end of the inductor L1 and one end of the capacitor C1 are connected to the first end 11a of the first LC parallel resonator 11R. One end of the inductor L2 and one end of the capacitor C2 are connected to the second end 12a of the second LC parallel resonator 12R. The other end of the inductor L1 and the other end of the inductor L2 are connected to one end of the inductor L3. The other end of the capacitor C1, the other end of the capacitor C2, and the other end of the inductor L3 are connected to the connection point CP.

The inductors L1 and L3 and the capacitor C1 are connected in parallel to constitute the first LC parallel resonator 11R. The inductors L2 and L3 and the capacitor C2 are connected in parallel to constitute the second LC parallel resonator 12R. The inductor L3 acts to enhance magnetic coupling between the inductor L1 and the inductor L2.

The first LC series resonator 21R includes a first-path capacitor C3. The second LC series resonator 22R includes a second-path capacitor C4. The first and second LC series resonators 21R and 22R include a common inductor L4.

One end of the capacitor C3 is connected to the first end 11a of the first LC parallel resonator 11R. One end of the capacitor C4 is connected to the second end 12a of the second LC parallel resonator 12R. The other end of the capacitor C3 and the other end of the capacitor C4 are connected to one end of the inductor L4. The other end of the inductor L4 is connected to the ground.

The capacitor C3 and the inductor L4 are connected in series to constitute the first LC series resonator 21R. The capacitor C4 and the inductor L4 are connected in series to constitute the second LC series resonator 22R.

The first path 21 and the second path 22 include a common path portion extending from the connection point between the inductor L4 and the capacitors C3, C4 to the ground. In this example, the inductance of the first path 21 and the inductance of the second path 22 are equal.

In FIG. 1, the capacitor symbol C6 represents a stray capacitance between the inductor L1 and the inductor L2.

Figure 2:
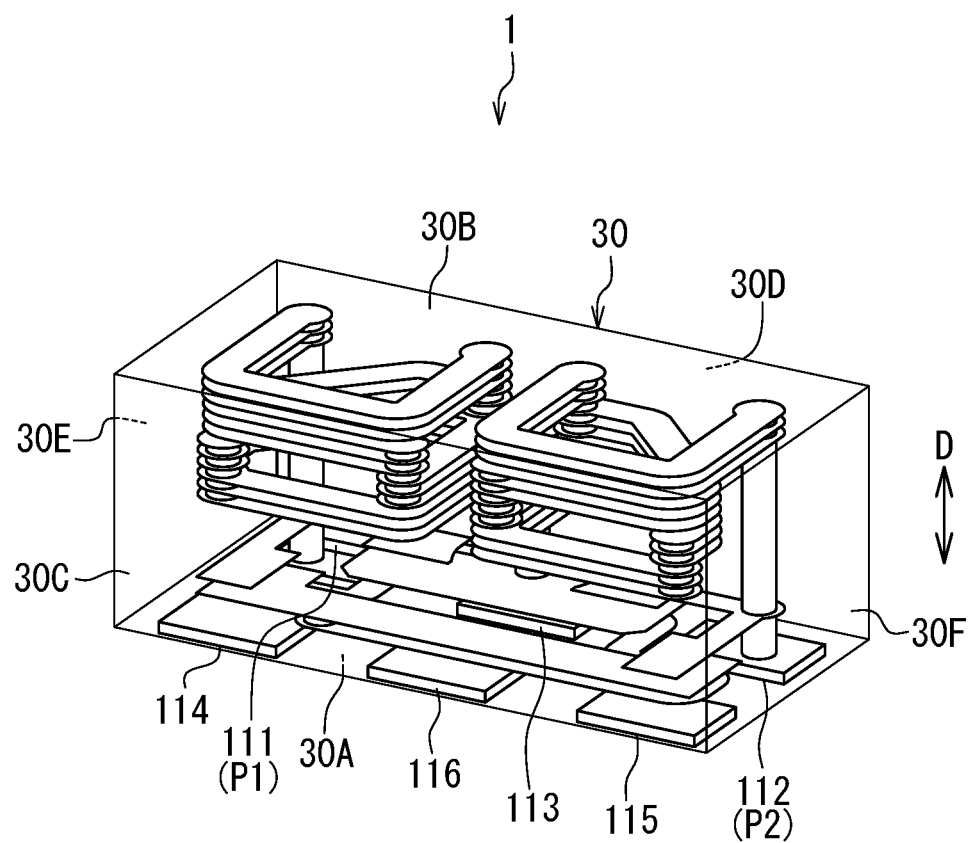
FIG. 2 is an internal perspective view of a multilayer stack in the low-pass filter according to the embodiment of the invention.
Figure 3:
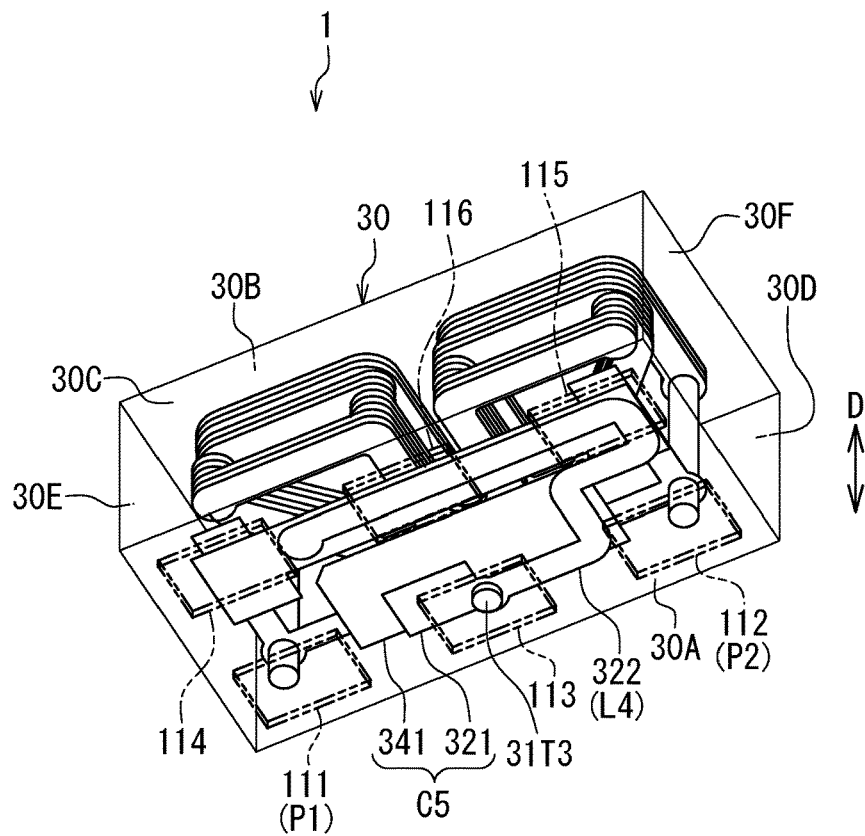
FIG. 3 is an internal perspective view of the multilayer stack in the low-pass filter according to the embodiment of the invention.

An example structure of the low-pass filter 1 will now be described. The low-pass filter 1 includes a multilayer stack 30 for integrating the first and second input/output ports P1 and P2, the first and second LC parallel resonators 11R and 12R, and the first to third paths 21 to 23. FIG. 2 and FIG. 3 are internal perspective views of the multilayer stack 30 of the low-pass filter 1. As will be described in detail later, the multilayer stack 30 includes a plurality of dielectric layers stacked to be aligned in a first direction D.

The multilayer stack 30 has a first end face 30A and a second end face 30B located at opposite ends in the first direction D. The first end face 30A and the second end face 30B face toward opposite directions. The multilayer stack 30 further has four side surfaces 30C and 30F. The side surfaces 30C and 30D face toward opposite directions. The side surfaces 30E and 30F face toward opposite directions. The side surfaces 30C to 30F are perpendicular to the first and second end faces 30A and 30B.

The low-pass filter 1 shown in FIG. 2 and FIG. 3 has a first input/output terminal 111, a second input/output terminal 112, a ground terminal 113, and three no-contact terminals 114, 115 and 116. The first and second input/output terminals 111 and 112 correspond to the first and second input/output ports P1 and P2 of FIG. 1, respectively. The ground terminal 113 is connected to the ground. The terminals 111 to 116 are disposed on the first end face 30A of the multilayer stack 30.

Figure 4:
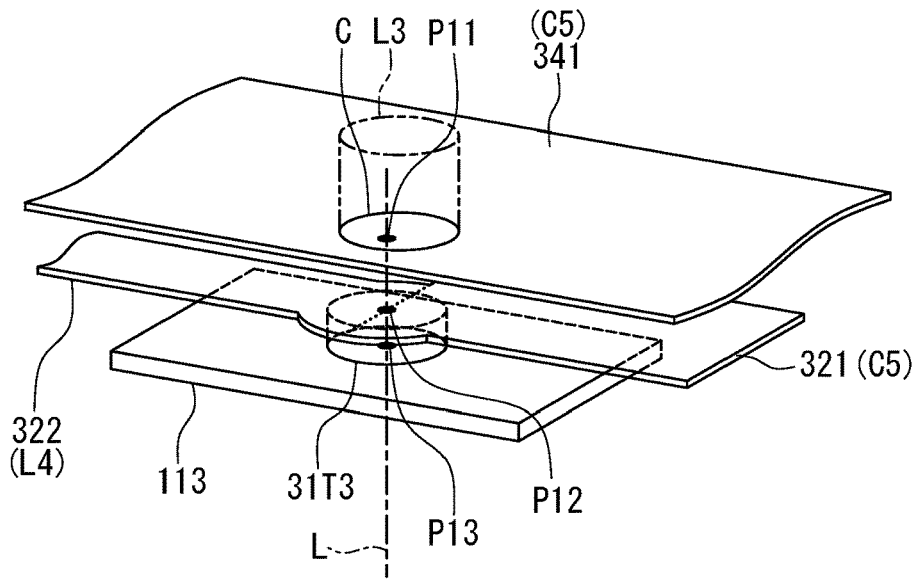
FIG. 4 is a partial perspective view of the multilayer stack of FIG. 2.
Figure 5A:
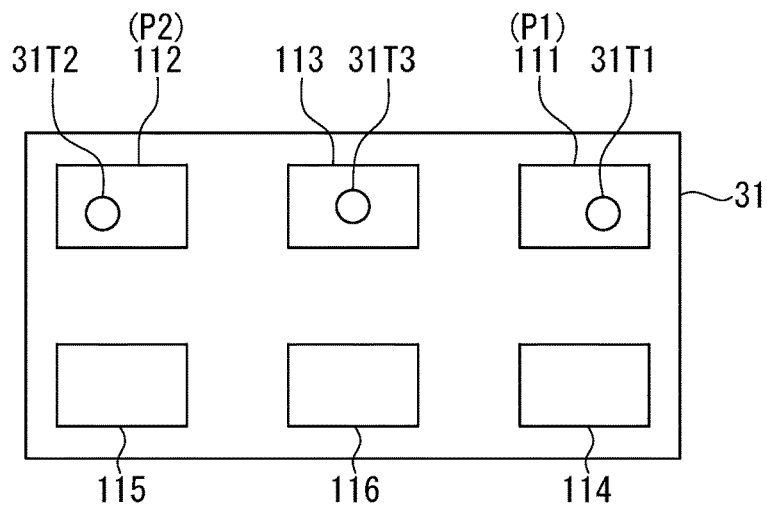
FIG. 5A is an explanatory diagram illustrating a patterned surface of a first dielectric layer of the multilayer stack of FIG. 2.
Figure 5B:
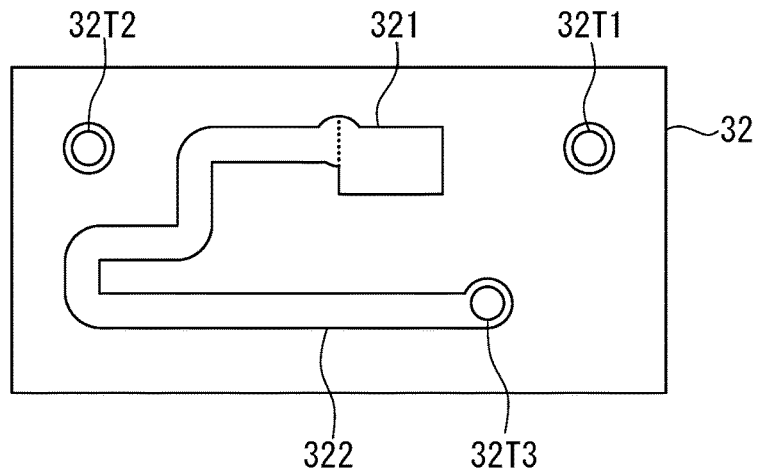
FIG. 5B is an explanatory diagram illustrating a patterned surface of a second dielectric layer of the multilayer stack of FIG. 2.
Figure 5C:
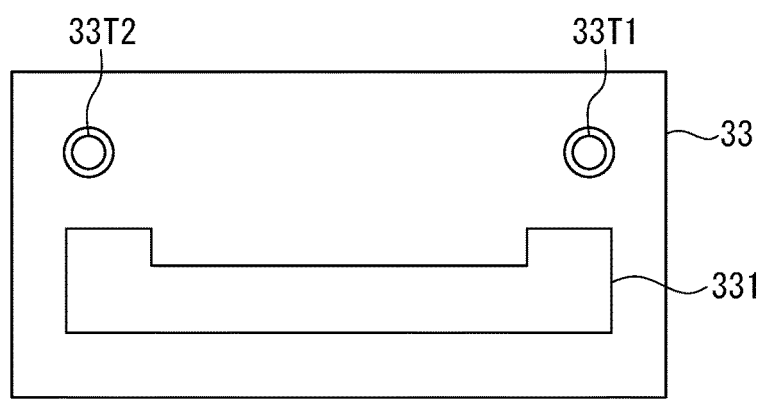
FIG. 5C is an explanatory diagram illustrating a patterned surface of a third dielectric layer of the multilayer stack of FIG. 2.
Figure 6A:
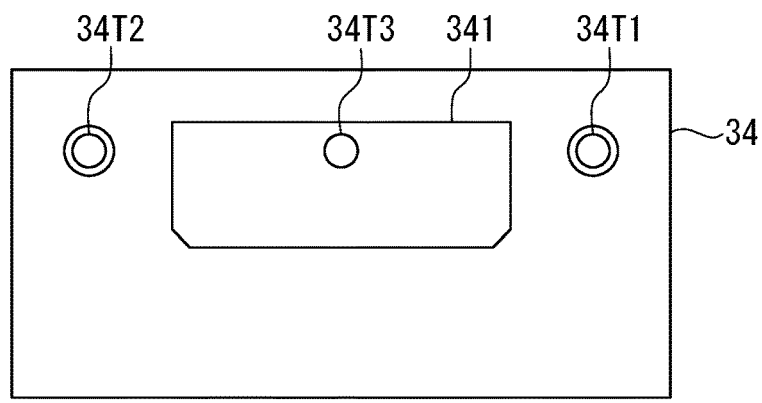
FIG. 6A is an explanatory diagram illustrating a patterned surface of a fourth dielectric layer of the multilayer stack of FIG. 2.
Figure 6B:
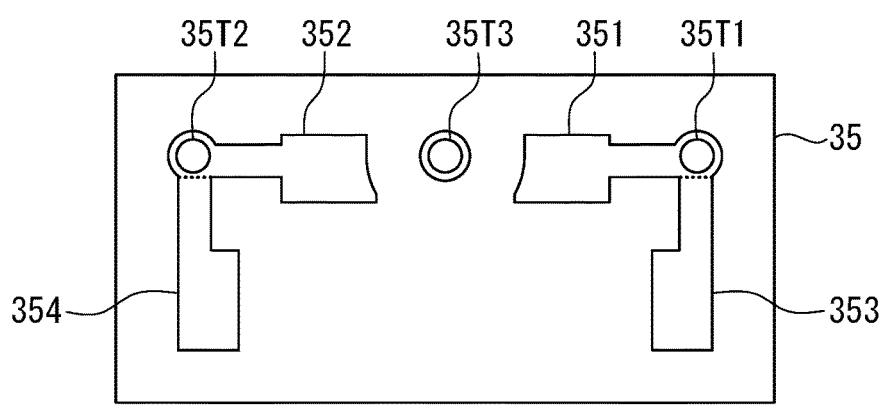
FIG. 6B is an explanatory diagram illustrating a patterned surface of a fifth dielectric layer of the multilayer stack of FIG. 2.
Figure 6C:
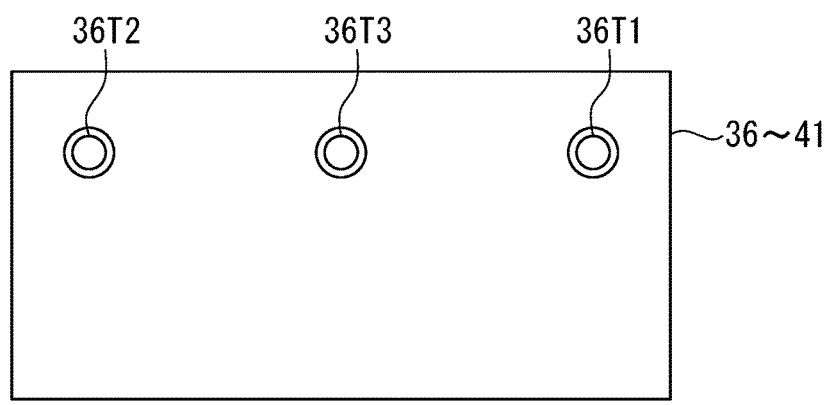
FIG. 6C is an explanatory diagram illustrating a patterned surface of each of a sixth to an eleventh dielectric layer of the multilayer stack of FIG. 2.
Figure 7A:
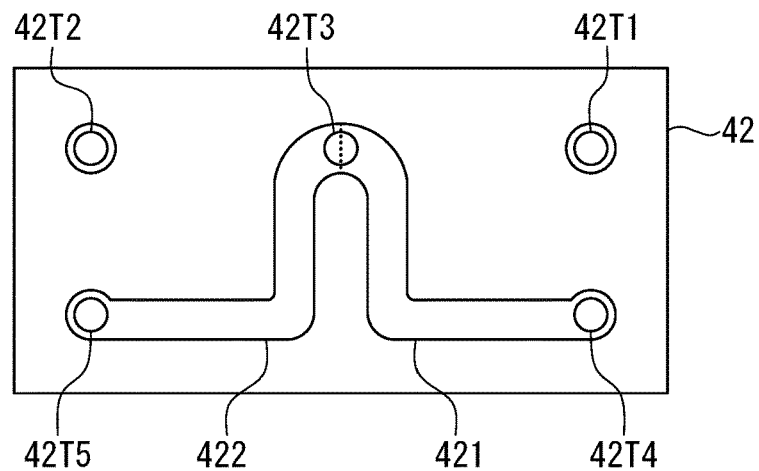
FIG. 7A is an explanatory diagram illustrating a patterned surface of a twelfth dielectric layer of the multilayer stack of FIG. 2.
Figure 7B:
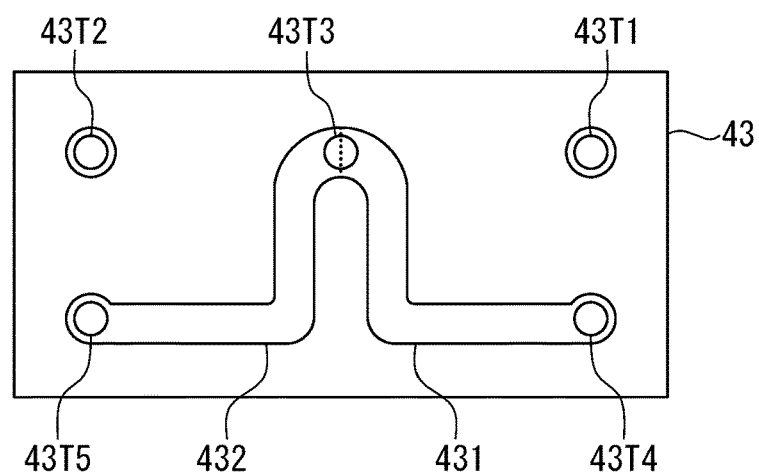
FIG. 7B is an explanatory diagram illustrating a patterned surface of a thirteenth dielectric layer of the multilayer stack of FIG. 2.
Figure 7C:
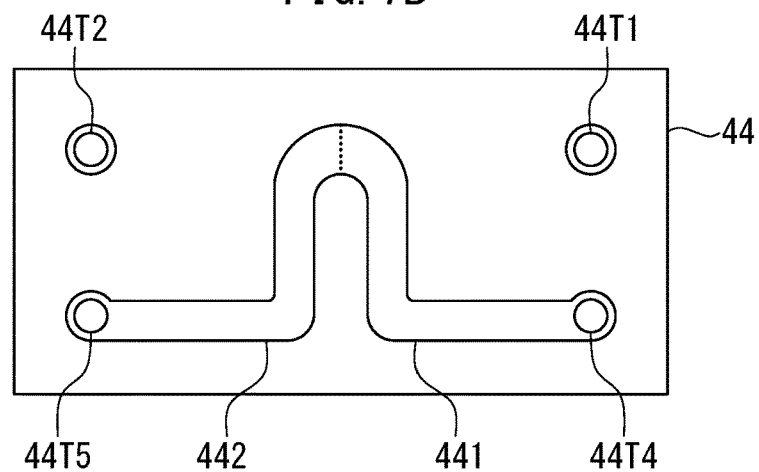
FIG. 7C is an explanatory diagram illustrating a patterned surface of a fourteenth dielectric layer of the multilayer stack of FIG. 2.
Figure 8A:
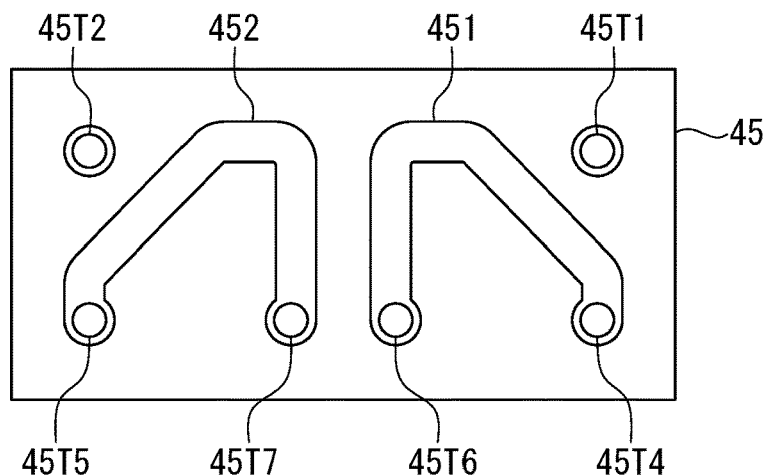
FIG. 8A is an explanatory diagram illustrating a patterned surface of a fifteenth dielectric layer of the multilayer stack of FIG. 2.
Figure 8B:
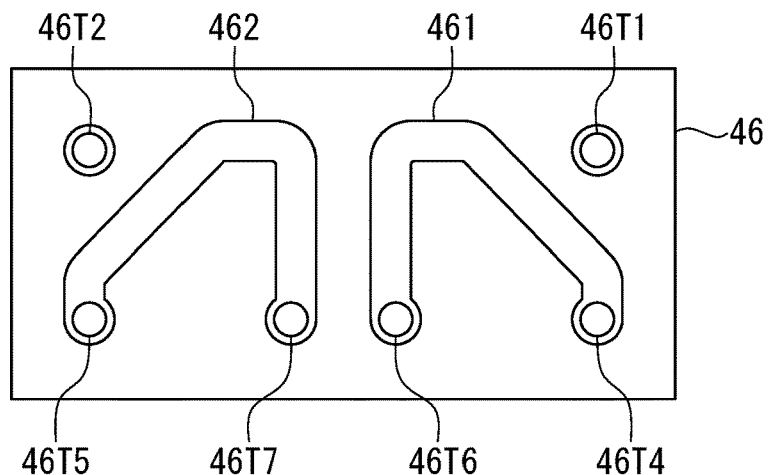
FIG. 8B is an explanatory diagram illustrating a patterned surface of a sixteenth dielectric layer of the multilayer stack of FIG. 2.
Figure 8C:
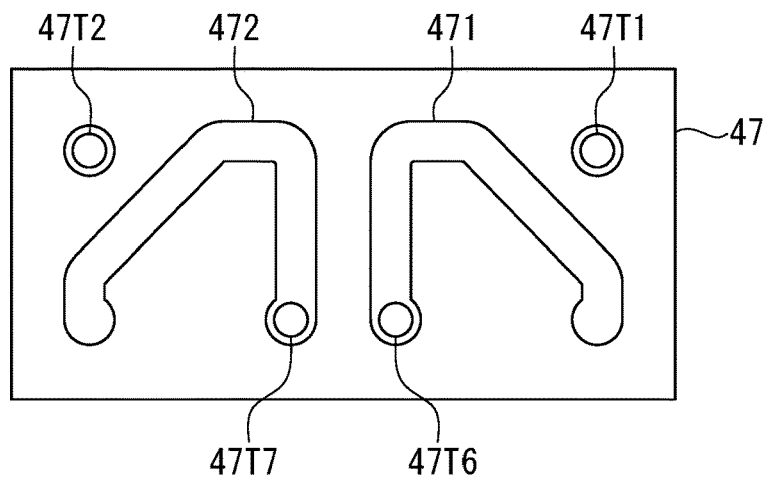
FIG. 8C is an explanatory diagram illustrating a patterned surface of a seventeenth dielectric layer of the multilayer stack of FIG. 2.
Figure 9A:
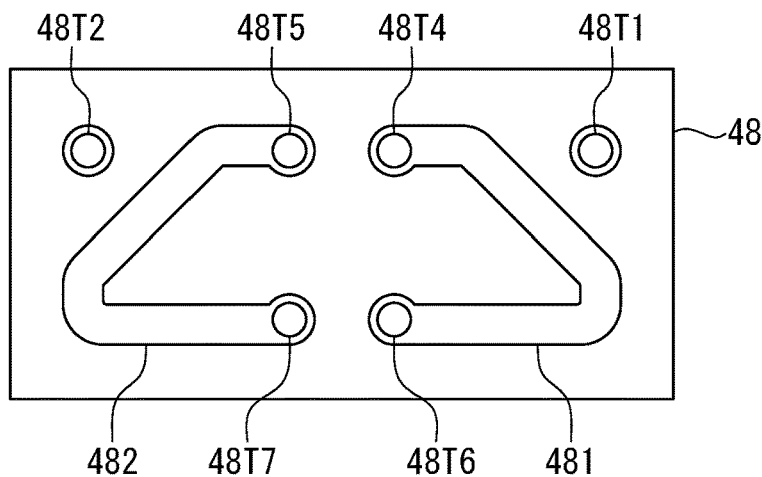
FIG. 9A is an explanatory diagram illustrating a patterned surface of an eighteenth dielectric layer of the multilayer stack of FIG. 2.
Figure 9B:
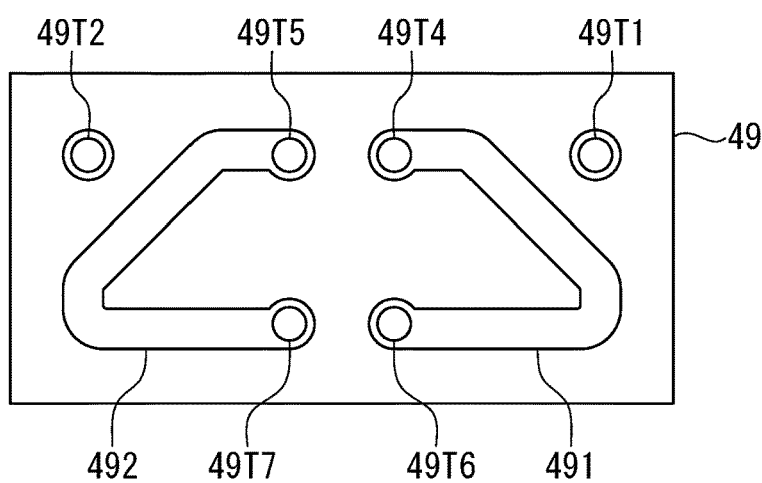
FIG. 9B is an explanatory diagram illustrating a patterned surface of a nineteenth dielectric layer of the multilayer stack of FIG. 2.
Figure 9C:
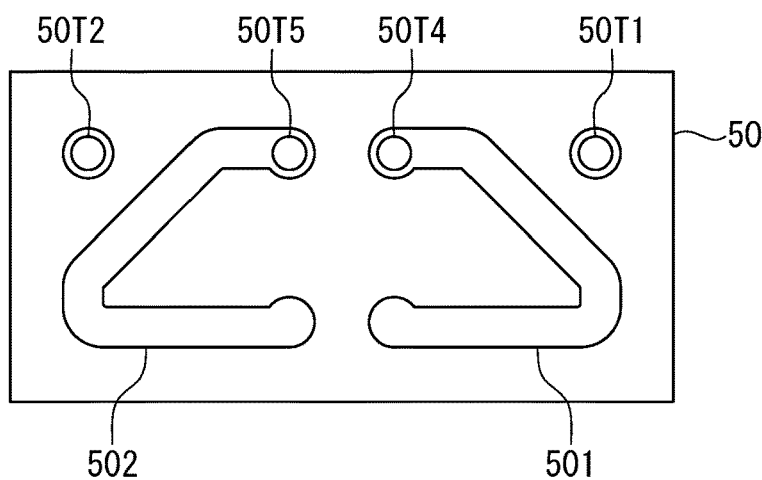
FIG. 9C is an explanatory diagram illustrating a patterned surface of a twentieth dielectric layer of the multilayer stack of FIG. 2.
Figure 10A:
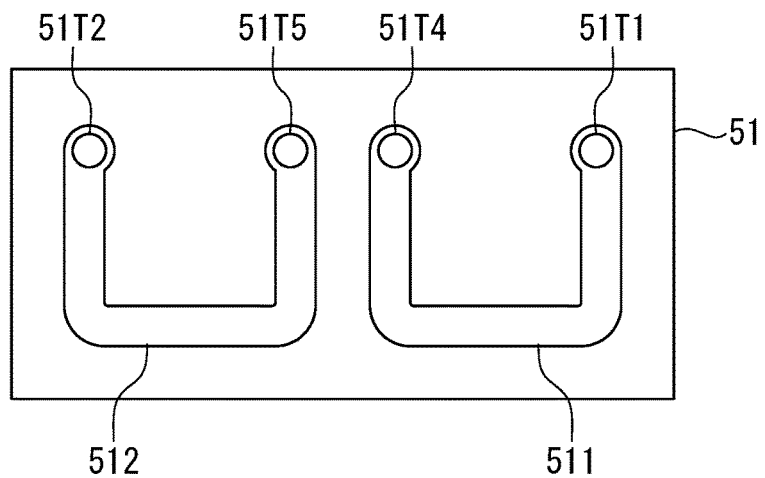
FIG. 10A is an explanatory diagram illustrating a patterned surface of a twenty-first dielectric layer of the multilayer stack of FIG. 2.
Figure 10B:
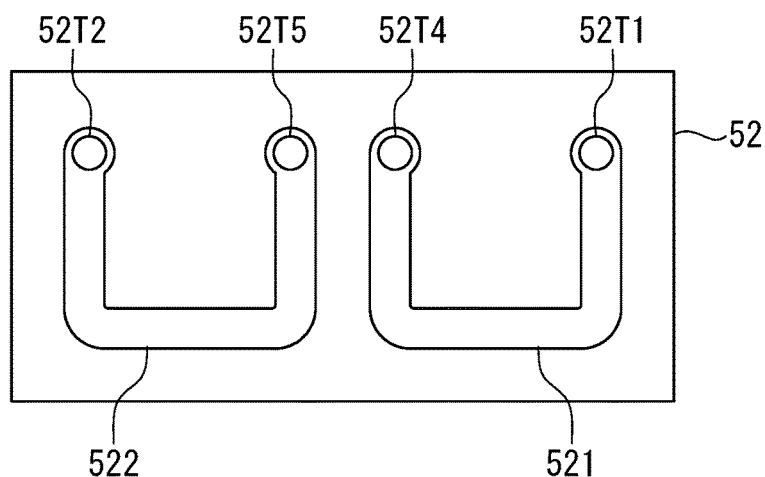
FIG. 10B is an explanatory diagram illustrating a patterned surface of a twenty-second dielectric layer of the multilayer stack of FIG. 2.
Figure 10C:
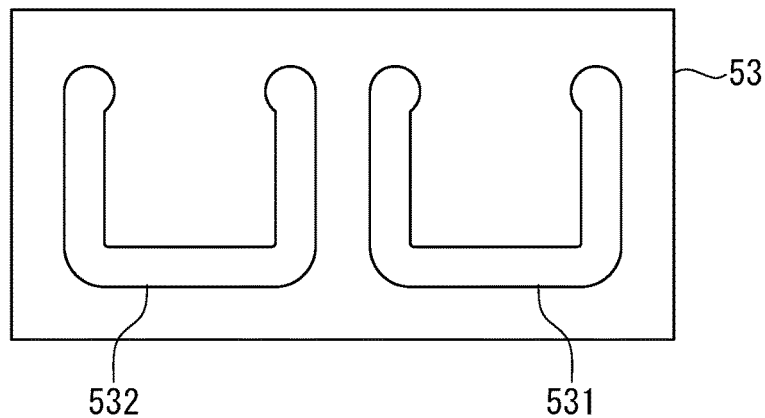
FIG. 10C is an explanatory diagram illustrating a patterned surface of a twenty-third dielectric layer of the multilayer stack of FIG. 2.
Figure 11:
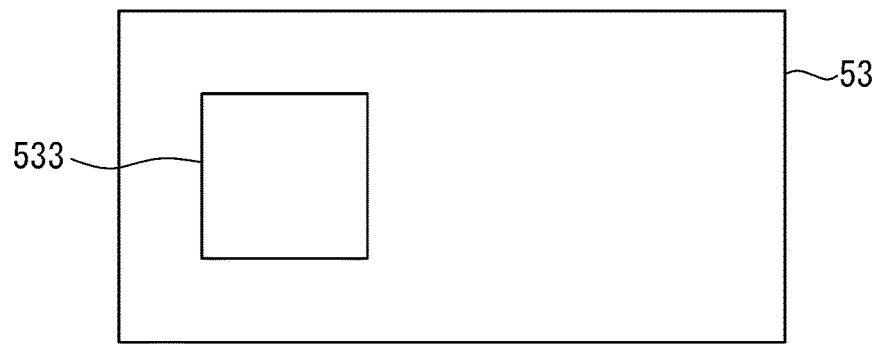
FIG. 11 is an explanatory diagram illustrating a marked surface of the twenty-third dielectric layer of the multilayer stack of FIG. 2.

The multilayer stack 30 will now be described in detail with reference to FIG. 2 to FIG. 11. The multilayer stack 30 includes 23 dielectric layers stacked together. The 23 dielectric layers will be referred to as the first to twenty-third dielectric layers in the order from bottom to top. FIG. 4 is a partial internal perspective view of the multilayer stack 30. FIG. 5A to FIG. 5C illustrate patterned surfaces of the first to third dielectric layers, respectively. FIG. 6A and FIG. 6B illustrate patterned surfaces of the fourth and fifth dielectric layers, respectively. FIG. 6C illustrates a patterned surface of each of the sixth to eleventh dielectric layers. FIG. 7A to FIG. 7C illustrate patterned surfaces of the twelfth to fourteenth dielectric layers, respectively. FIG. 8A to FIG. 8C illustrate patterned surfaces of the fifteenth to seventeenth dielectric layers, respectively. FIG. 9A to FIG. 9C illustrate patterned surfaces of the eighteenth to twentieth dielectric layers, respectively. FIG. 10A to FIG. 10C illustrate patterned surfaces of the twenty-first to twenty-third dielectric layers, respectively. FIG. 11 illustrates a marked surface of the twenty-third dielectric layer. The patterned surface and the marked surface of the twenty-third dielectric layer face toward opposite directions.

On the patterned surface of the first dielectric layer 31, as shown in FIG. 5A, there are formed the first input/output terminal 111, the second input/output terminal 112, the ground terminal 113, and the no-contact terminals 114, 115 and 116. Further, formed in the dielectric layer 31 are through holes 31T1 and 31T2 connected to the terminals 111 and 112, respectively, and a ground through hole 31T3 connected to the terminal 113.

On the patterned surface of the second dielectric layer 32, as shown in FIG. 5B, there are formed a first conductor layer 321 used for forming the third-path capacitor C5, and an inductor conductor layer 322 used for forming the inductor L4. The inductor conductor layer 322 has a first end and a second end. The first conductor layer 321 is connected to the first end of the inductor conductor layer 322. In FIG. 5B the boundary between the first conductor layer 321 and the inductor conductor layer 322 is indicated by a dotted line. Further, through holes 32T1, 32T2 and 32T3 are formed in the dielectric layer 32. The through holes 31T1 and 31T2 shown in FIG. 5A are connected to the through holes 32T1 and 32T2, respectively. The through hole 32T3 is connected to a portion of the inductor conductor layer 322 near the second end thereof. The ground through hole 31T3 shown in FIG. 5A is connected to portions of the first conductor layer 321 and the inductor conductor layer 322 near the boundary between the first conductor layer 321 and the inductor conductor layer 322.

On the patterned surface of the third dielectric layer 33, as shown in FIG. 5C, there is formed a conductor layer 331 used for forming the first- and second-path capacitors C3 and C4. Further, through holes 33T1 and 33T2 are formed in the dielectric layer 33. The through holes 32T1 and 32T2 shown in FIG. 5B are connected to the through holes 33T1 and 33T2, respectively. The through hole 32T3 shown in FIG. 5B is connected to the conductor layer 331.

On the patterned surface of the fourth dielectric layer 34, as shown in FIG. 6A, there is formed a second conductor layer 341 used for forming the capacitors C1 and C2 and the third-path capacitor C5. Further, through holes 34T1, 34T2 and 34T3 are formed in the dielectric layer 34. The through holes 33T1 and 33T2 shown in FIG. 5C are connected to the through holes 34T1 and 34T2, respectively. The through hole 34T3 is connected to the conductor layer 341.

On the patterned surface of the fifth dielectric layer 35, as shown in FIG. 6B, there are formed a conductor layer 351 used for forming the capacitor C1, a conductor layer 352 used for forming the capacitor C2, a conductor layer 353 used for forming the first-path capacitor C3, and a conductor layer 354 used for forming the second-path capacitor C4. The conductor layer 351 and the conductor layer 353 are connected to each other. The conductor layer 352 and the conductor layer 354 are connected to each other. In FIG. 6B the boundary between the conductor layer 351 and the conductor layer 353 and the boundary between the conductor layer 352 and the conductor layer 354 are indicated by dotted lines. Further, through holes 35T1, 35T2 and 35T3 are formed in the dielectric layer 35. The through holes 35T1 and 35T2 are connected to the conductor layers 351 and 352, respectively. The through holes 34T1 and 34T2 shown in FIG. 6A are connected to the through holes 35T1 and 35T2, respectively. The through hole 34T3 shown in FIG. 6A is connected to the through hole 35T3.

As shown in FIG. 6C, through holes 36T1, 36T2 and 36T3 are formed in each of the sixth to eleventh dielectric layers 36 to 41. In the dielectric layers 36 to 41, every vertically adjacent through holes denoted by the same reference signs are connected to each other. The through holes 35T1 to 35T3 shown in FIG. 6B are respectively connected to the through holes 36T1 to 36T3 formed in the dielectric layer 36.

As shown in FIG. 7A, conductor layers 421 and 422 are formed on the twelfth dielectric layer 42. The conductor layer 421 is used for forming the inductor L1. The conductor layer 422 is used for forming the inductor L2. Each of the conductor layers 421 and 422 has a first end and a second end. The first end of the conductor layer 421 and the first end of the conductor layer 422 are connected to each other. In FIG. 7A the boundary between the conductor layers 421 and 422 is indicated by a dotted line. Further, formed in the dielectric layer 42 are through holes 42T1, 42T2, 42T3, 42T4 and 42T5. The through holes 36T1 and 36T2 formed in the dielectric layer 41 of FIG. 6C are connected to the through holes 42T1 and 42T2, respectively. The through hole 42T3 is connected to portions of the conductor layers 421 and 422 near the boundary between the conductor layers 421 and 422. The through hole 36T3 formed in the dielectric layer 41 of FIG. 6C is connected to the through hole 42T3. The through hole 42T4 is connected to a portion of the conductor layer 421 near the second end thereof. The through hole 42T5 is connected to a portion of the conductor layer 422 near the second end thereof.

As shown in FIG. 7B, conductor layers 431 and 432 are formed on the thirteenth dielectric layer 43. The conductor layer 431 is used for forming the inductor L1. The conductor layer 432 is used for forming the inductor L2. Each of the conductor layers 431 and 432 has a first end and a second end. The first end of the conductor layer 431 and the first end of the conductor layer 432 are connected to each other. In FIG. 7B the boundary between the conductor layers 431 and 432 is indicated by a dotted line. Further, formed in the dielectric layer 43 are through holes 43T1, 43T2, 43T3, 43T4 and 43T5. The through hole 43T3 is connected to portions of the conductor layers 431 and 432 near the boundary between the conductor layers 431 and 432. The through hole 43T4 is connected to a portion of the conductor layer 431 near the second end thereof. The through hole 43T5 is connected to a portion of the conductor layer 432 near the second end thereof. The through holes 42T1, 42T2, 42T3, 42T4 and 42T5 shown in FIG. 7A are connected to the through holes 43T1, 43T2, 43T3, 43T4 and 43T5, respectively.

As shown in FIG. 7C, conductor layers 441 and 442 are formed on the fourteenth dielectric layer 44. The conductor layer 441 is used for forming the inductor L1. The conductor layer 442 is used for forming the inductor L2. Each of the conductor layers 441 and 442 has a first end and a second end. The first end of the conductor layer 441 and the first end of the conductor layer 442 are connected to each other. In FIG. 7C the boundary between the conductor layers 441 and 442 is indicated by a dotted line. Further, formed in the dielectric layer 44 are through holes 44T1, 44T2, 44T4 and 44T5. The through hole 44T4 is connected to a portion of the conductor layer 441 near the second end thereof. The through hole 44T5 is connected to a portion of the conductor layer 442 near the second end thereof. The through holes 43T1, 43T2, 43T4 and 43T5 shown in FIG. 7B are connected to the through holes 44T1, 44T2, 44T4 and 44T5, respectively. The through hole 43T3 shown in FIG. 7B is connected to portions of the conductor layers 441 and 442 near the boundary between the conductor layers 441 and 442.

As shown in FIG. 8A, conductor layers 451 and 452 are formed on the fifteenth dielectric layer 45. The conductor layer 451 is used for forming the inductor L1. The conductor layer 452 is used for forming the inductor L2. Each of the conductor layers 451 and 452 has a first end and a second end. Further, formed in the dielectric layer 45 are through holes 45T1, 45T2, 45T4, 45T5, 45T6 and 45T7. The through hole 45T4 is connected to a portion of the conductor layer 451 near the first end thereof. The through hole 45T5 is connected to a portion of the conductor layer 452 near the first end thereof. The through hole 45T6 is connected to a portion of the conductor layer 451 near the second end thereof. The through hole 45T7 is connected to a portion of the conductor layer 452 near the second end thereof. The through holes 44T1, 44T2, 44T4 and 44T5 shown in FIG. 7C are connected to the through holes 45T1, 45T2, 45T4 and 45T5, respectively.

As shown in FIG. 8B, conductor layers 461 and 462 are formed on the sixteenth dielectric layer 46. The conductor layer 461 is used for forming the inductor L1. The conductor layer 462 is used for forming the inductor L2. Each of the conductor layers 461 and 462 has a first end and a second end. Further, formed in the dielectric layer 46 are through holes 46T1, 46T2, 46T4, 46T5, 46T6 and 46T7. The through hole 46T4 is connected to a portion of the conductor layer 461 near the first end thereof. The through hole 46T5 is connected to a portion of the conductor layer 462 near the first end thereof. The through hole 46T6 is connected to a portion of the conductor layer 461 near the second end thereof. The through hole 46T7 is connected to a portion of the conductor layer 462 near the second end thereof. The through holes 45T1, 45T2, 45T4, 45T5, 45T6 and 45T7 shown in FIG. 8A are connected to the through holes 46T1, 46T2, 46T4, 46T5, 46T6 and 46T7, respectively.

As shown in FIG. 8C, conductor layers 471 and 472 are formed on the seventeenth dielectric layer 47. The conductor layer 471 is used for forming the inductor L1. The conductor layer 472 is used for forming the inductor L2. Each of the conductor layers 471 and 472 has a first end and a second end. Further, formed in the dielectric layer 47 are through holes 47T1, 47T2, 47T6 and 47T7. The through hole 47T6 is connected to a portion of the conductor layer 471 near the second end thereof. The through hole 47T7 is connected to a portion of the conductor layer 472 near the second end thereof. The through holes 46T1, 46T2, 46T6 and 46T7 shown in FIG. 8B are connected to the through holes 47T1, 47T2, 47T6 and 47T7, respectively. The through hole 46T4 shown in FIG. 8B is connected to a portion of the conductor layer 471 near the first end thereof. The through hole 46T5 shown in FIG. 8B is connected to a portion of the conductor layer 472 near the first end thereof.

As shown in FIG. 9A, conductor layers 481 and 482 are formed on the eighteenth dielectric layer 48. The conductor layer 481 is used for forming the inductor L1. The conductor layer 482 is used for forming the inductor L2. Each of the conductor layers 481 and 482 has a first end and a second end. Further, formed in the dielectric layer 48 are through holes 48T1, 48T2, 48T4, 48T5, 48T6 and 48T7. The through hole 48T4 is connected to a portion of the conductor layer 481 near the first end thereof. The through hole 48T5 is connected to a portion of the conductor layer 482 near the first end thereof. The through hole 48T6 is connected to a portion of the conductor layer 481 near the second end thereof. The through hole 48T7 is connected to a portion of the conductor layer 482 near the second end thereof. The through holes 47T1, 47T2, 47T6 and 47T7 shown in FIG. 8C are connected to the through holes 48T1, 48T2, 48T6 and 48T7, respectively.

As shown in FIG. 9B, conductor layers 491 and 492 are formed on the nineteenth dielectric layer 49. The conductor layer 491 is used for forming the inductor L1. The conductor layer 492 is used for forming the inductor L2. Each of the conductor layers 491 and 492 has a first end and a second end. Further, formed in the dielectric layer 49 are through holes 49T1, 49T2, 49T4, 49T5, 49T6 and 49T7. The through hole 49T4 is connected to a portion of the conductor layer 491 near the first end thereof. The through hole 49T5 is connected to a portion of the conductor layer 492 near the first end thereof. The through hole 49T6 is connected to a portion of the conductor layer 491 near the second end thereof. The through hole 49T7 is connected to a portion of the conductor layer 492 near the second end thereof. The through holes 48T1, 48T2, 48T4, 48T5, 48T6 and 48T7 shown in FIG. 9A are connected to the through holes 49T1, 49T2, 49T4, 49T5, 49T6 and 49T7, respectively.

As shown in FIG. 9C, conductor layers 501 and 502 are formed on the twentieth dielectric layer 50. The conductor layer 501 is used for forming the inductor L1. The conductor layer 502 is used for forming the inductor L2. Each of the conductor layers 501 and 502 has a first end and a second end. Further, formed in the dielectric layer 50 are through holes 50T1, 50T2, 50T4 and 50T5. The through hole 50T4 is connected to a portion of the conductor layer 501 near the first end thereof. The through hole 50T5 is connected to a portion of the conductor layer 502 near the first end thereof. The through holes 49T1, 49T2, 49T4 and 49T5 shown in FIG. 9B are connected to the through holes 50T1, 50T2, 50T4 and 50T5, respectively. The through hole 49T6 shown in FIG. 9B is connected to a portion of the conductor layer 501 near the second end thereof. The through hole 49T7 shown in FIG. 9B is connected to a portion of the conductor layer 502 near the second end thereof.

As shown in FIG. 10A, conductor layers 511 and 512 are formed on the twenty-first dielectric layer 51. The conductor layer 511 is used for forming the inductor L1. The conductor layer 512 is used for forming the inductor L2. Each of the conductor layers 511 and 512 has a first end and a second end. Further, formed in the dielectric layer 51 are through holes 51T1, 51T2, 51T4 and 51T5. The through hole 51T1 is connected to a portion of the conductor layer 511 near the second end thereof. The through hole 51T2 is connected to a portion of the conductor layer 512 near the second end thereof. The through hole 51T4 is connected to a portion of the conductor layer 511 near the first end thereof. The through hole 51T5 is connected to a portion of the conductor layer 512 near the first end thereof. The through holes 50T1, 50T2, 50T4 and 50T5 shown in FIG. 9C are connected to the through holes 51T1, 51T2, 51T4 and 51T5, respectively.

As shown in FIG. 10B, conductor layers 521 and 522 are formed on the twenty-second dielectric layer 52. The conductor layer 521 is used for forming the inductor L1. The conductor layer 522 is used for forming the inductor L2. Each of the conductor layers 521 and 522 has a first end and a second end. Further, formed in the dielectric layer 52 are through holes 52T1, 52T2, 52T4 and 52T5. The through hole 52T1 is connected to a portion of the conductor layer 521 near the second end thereof. The through hole 52T2 is connected to a portion of the conductor layer 522 near the second end thereof. The through hole 52T4 is connected to a portion of the conductor layer 521 near the first end thereof. The through hole 52T5 is connected to a portion of the conductor layer 522 near the first end thereof. The through holes 51T1, 51T2, 51T4 and 51T5 shown in FIG. 10A are connected to the through holes 52T1, 52T2, 52T4 and 52T5, respectively.

As shown in FIG. 10C, conductor layers 531 and 532 are formed on the twenty-third dielectric layer 53. The conductor layer 531 is used for forming the inductor L1. The conductor layer 532 is used for forming the inductor L2. Each of the conductor layers 531 and 532 has a first end and a second end. The through hole 52T1 shown in FIG. 10B is connected to a portion of the conductor layer 531 near the second end thereof. The through hole 52T2 shown in FIG. 10B is connected to a portion of the conductor layer 532 near the second end thereof. The through hole 52T4 shown in FIG. 10B is connected to a portion of the conductor layer 531 near the first end thereof. The through hole 52T5 shown in FIG. 10B is connected to a portion of the conductor layer 532 near the first end thereof.

As shown in FIG. 11, a mark 533 formed of a conductor layer lies on the marked surface of the twenty-third dielectric layer 53.

The multilayer stack 30 shown in FIG. 2 and FIG. 3 is formed by stacking the first to twenty-third dielectric layers 31 to 53 such that the patterned surface of the first dielectric layer 31 constitutes the first end face 30A, while the marked surface of the twenty-third dielectric layer 53 constitutes the second end face 30B. FIG. 2 and FIG. 3 omit the illustration of the mark 533.

For example, the multilayer stack 30 is fabricated by a low-temperature co-firing method, using ceramic as the material of the dielectric layers 31 to 53. In this case, a plurality of ceramic green sheets, which are to become the dielectric layers 31 to 53 later, are fabricated first. Each ceramic green sheet has a plurality of unfired conductor layers formed thereon and a plurality of unfired through holes formed therein. The plurality of unfired conductor layers are to become a plurality of conductor layers later. The plurality of unfired through holes are to become a plurality of through holes later. At this point in time, any unfired conductor layer that is to later become the mark 533 is not yet formed on a ceramic green sheet that is to later become the dielectric layer 53. Next, the plurality of ceramic green sheets are stacked together into a green sheet stack. Then, an unfired conductor layer that is to later become the mark 533 is formed on one of the ceramic green sheets of the green sheet stack, the one of the ceramic green sheets becoming the dielectric layer 53 later. The green sheet stack is then cut to form an unfired stack. The ceramic and conductor in the unfired stack are then fired by a low-temperature co-firing method to thereby complete the multilayer stack 30.

Correspondences between the circuit components of the low-pass filter 1 shown in FIG. 1 and the internal components of the multilayer stack 30 shown in FIG. 5A to FIG. 10C will now be described. The inductor L1 of the first LC parallel resonator 11R is composed of the conductor layers 421, 431, 441, 451, 461, 471, 481, 491, 501, 511, 521 and 531 shown in FIG. 7A to FIG. 10C and the through holes formed in these conductor layers. The conductor layer 511 is connected to the first input/output terminal 111 via the through holes 31T1, 32T1, 33T1, 34T1, 35T1, 36T1, 42T1, 43T1, 44T1, 45T1, 46T1, 47T1, 48T1, 49T1 and 50T1.

The capacitor C1 of the first LC parallel resonator 11R is composed of the conductor layers 341 and 351 shown in FIG. 6A and FIG. 6B, and the dielectric layer 34 interposed between the conductor layers 341 and 351. The conductor layer 351 is connected to the first input/output terminal 111 via the through holes 31T1, 32T1, 33T1 and 34T1.

The inductor L2 of the second LC parallel resonator 12R is composed of the conductor layers 422, 432, 442, 452, 462, 472, 482, 492, 502, 512, 522 and 532 shown in FIG. 7A to FIG. 10C and the through holes formed in these conductor layers. The conductor layer 512 is connected to the second input/output terminal 112 via the through holes 31T2, 32T2, 33T2, 34T2, 35T2, 36T2, 42T2, 43T2, 44T2, 45T2, 46T2, 47T2, 48T2, 49T2 and 50T2.

The capacitor C2 of the second LC parallel resonator 12R is composed of the conductor layers 341 and 352 shown in FIG. 6A and FIG. 6B, and the dielectric layer 34 interposed between the conductor layers 341 and 352. The conductor layer 352 is connected to the second input/output terminal 112 via the through holes 31T2, 32T2, 33T2 and 34T2.

The common inductor L3 of the first and second LC parallel resonators 11R and 12R is composed of the through holes 34T3, 35T3 and 36T3 shown in FIG. 6A to FIG. 6C. The through hole 34T3 is connected to the conductor layer 341 forming the capacitors C1 and C2. The through hole 36T3 formed in the dielectric layer 41 is connected to the conductor layer 421 forming the inductor L1 and to the conductor layer 422 forming the inductor L2.

The first-path capacitor C3 of the first LC series resonator 21R is composed of the conductor layers 331 and 353 shown in FIG. 5C and FIG. 6B and the dielectric layers 33 and 34 between the conductor layers 331 and 353. The conductor layer 353 is connected to the first input/output terminal 111 via the through holes 31T1, 32T1, 33T1 and 34T1 and the conductor layer 351.

The second-path capacitor C4 of the second LC series resonator 22R is composed of the conductor layers 331 and 354 shown in FIG. 5C and FIG. 6B and the dielectric layers 33 and 34 between the conductor layers 331 and 354. The conductor layer 354 is connected to the second input/output terminal 112 via the through holes 31T2, 32T2, 33T2 and 34T2 and the conductor layer 352.

The third-path capacitor C5 of the third path 23 is composed of the first and second conductor layers 321 and 341 shown in FIG. 5B and FIG. 6A and the dielectric layers 32 and 33 between the first and second conductor layers 321 and 341. The first and second conductor layers 321 and 341 are located at different positions in the first direction D and opposed to each other. In the present embodiment, the third path 23 includes the ground through hole 31T3. The ground through hole 31T3 has one end connected to the first conductor layer 321 and the other end connected to the ground terminal 113.

The common inductor L4 of the first and second LC series resonators 21R and 22R is composed mainly of the inductor conductor layer 322 shown in FIG. 5B. The conductor layer 322 and the through hole 32T3 connect the aforementioned one end of the ground through hole 31T3 and the conductor layer 331 forming the first- and second-path capacitors C3 and C4.

Reference is now made to FIG. 1 and FIG. 4 to describe the relative positions of the connection point CP, the third-path capacitor C5 and the ground terminal 113. In FIG. 4, the circle labeled C represents a connection between the second conductor layer 341 and the through hole 34T3. The second conductor layer 341 forms the third-path capacitor C5. The through hole 34T3 forms the inductor L3. The connection C is a physical connection corresponding to the connection point CP shown in FIG. 1.

In FIG. 4, the straight line labeled L represents an imaginary straight line extending in the first direction D (see FIG. 2 and FIG. 3). The connection C, the third-path capacitor C5 and the ground terminal 113 are arranged to intersect or contact the imaginary straight line L. FIG. 4 illustrates an example of the imaginary straight line L. In this example, the connection C, the second conductor layer 341 forming the third-path capacitor C5, and the ground terminal 113 intersect the imaginary straight line L, and the first conductor layer 321 forming the third-path capacitor C5 contacts the imaginary straight line L. In FIG. 4, the point labeled P11 represents the point of intersection of the connection C, the second conductor layer 341 and the imaginary straight line L; the point labeled P12 represents the point of contact of the first conductor layer 341 and the imaginary straight line L; and the point labeled P13 represents the point of intersection of the ground terminal 113 and the imaginary straight line L.

The operation and effect of the low-pass filter 1 according to the present embodiment will now be described. The low-pass filter 1 is configured so that when signals are received at one of the first and second input/output ports P1 and P2, some of the signals having a frequency lower than or equal to the cutoff frequency of the low-pass filter 1 selectively pass through the low-pass filter 1 and are outputted from the other of the first and second input/output ports P1 and P2. The insertion loss of the low-pass filter 1 according to the present embodiment has such a frequency characteristic that one or more attenuation poles are formed in the stop band.

The effect of the low-pass filter 1 according to the present embodiment will now be described with reference to simulation results obtained for the low-pass filter 1 according to the present embodiment and a low-pass filter 101 of a comparative example.

Figure 12:
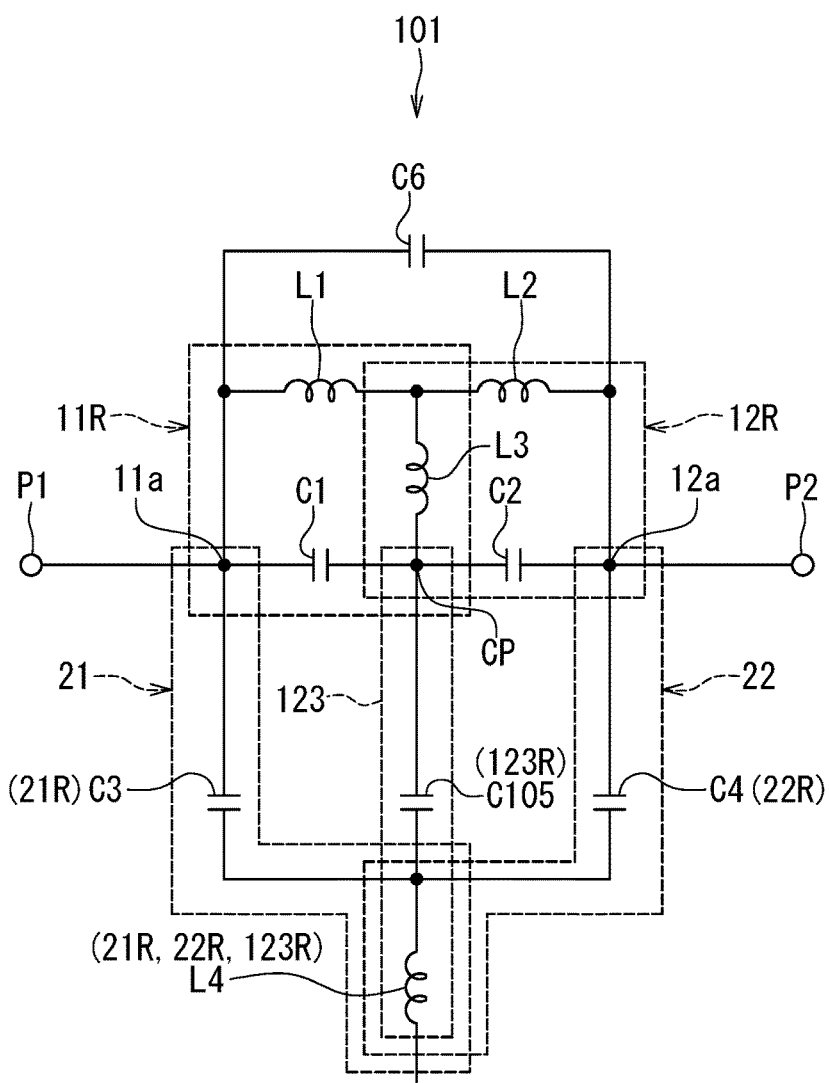
FIG. 12 is a circuit diagram illustrating the circuit configuration of a low-pass filter of a comparative example used in a simulation.

FIG. 12 is a circuit diagram illustrating the circuit configuration of the low-pass filter 101 of the comparative example. The low-pass filter 101 includes a third path 123 in place of the third path 23 of the low-pass filter 1. The third path 123 includes a third-path capacitor C105 and connects the connection point CP between the first and second LC parallel resonators 11R and 12R to the ground. One end of the third-path capacitor C105 is connected to the connection point CP. The other end of the third-path capacitor C105 is connected to one end of the inductor L4. The capacitor C105 and the inductor L4 are connected in series to constitute a third LC series resonator 123R. The remainder of configuration of the low-pass filter 101 is the same as that of the low-pass filter 1.

Figure 13:
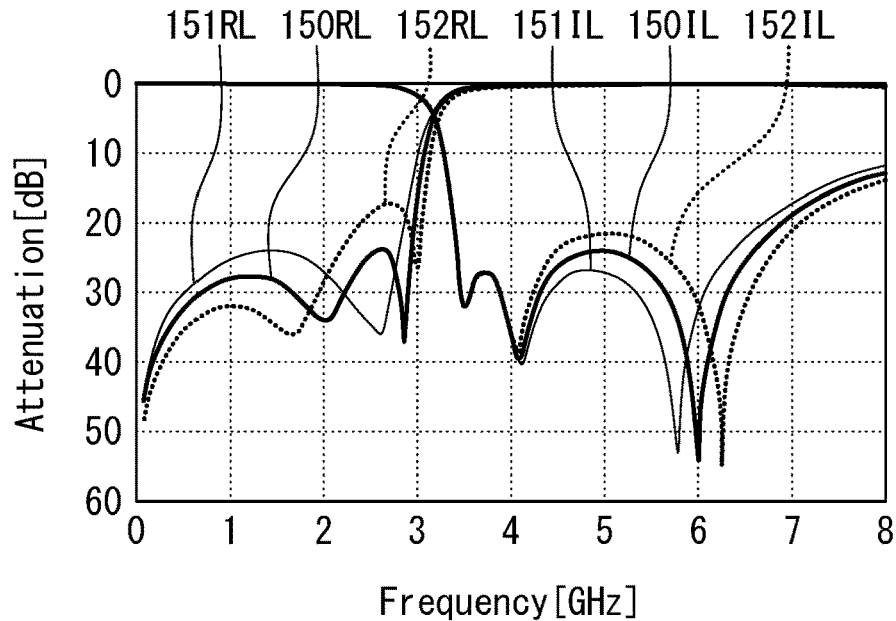
FIG. 13 is a characteristic diagram illustrating the characteristics of the low-pass filter of the comparative example in the simulation.
Figure 14:
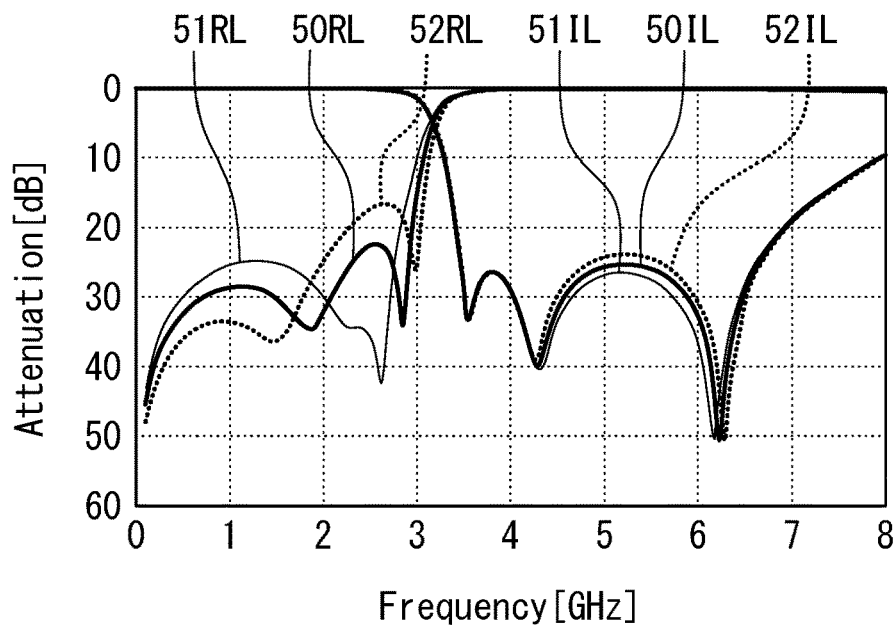
FIG. 14 is a characteristic diagram illustrating the characteristics of a first low-pass filter model in the simulation.
Figure 15:
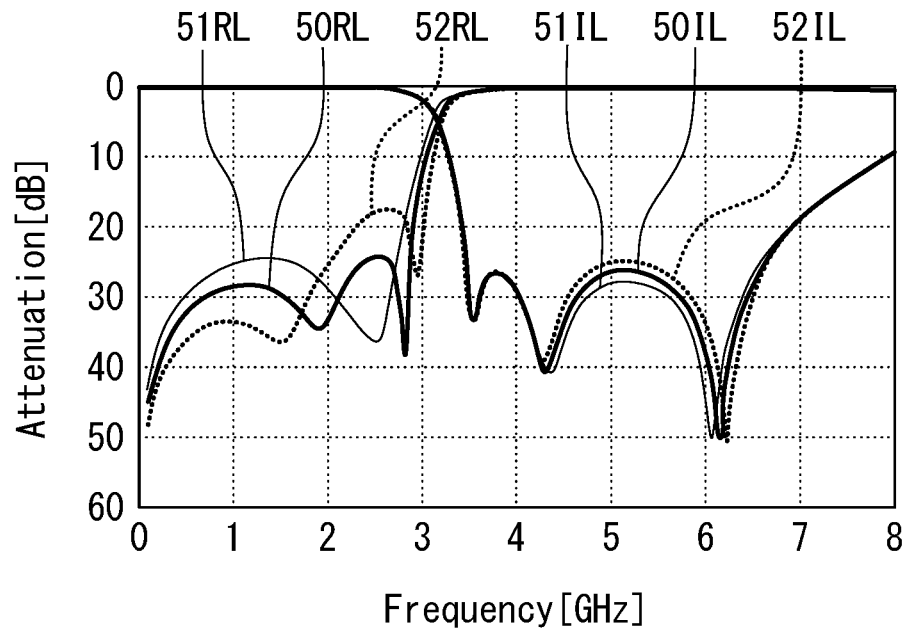
FIG. 15 is a characteristic diagram illustrating the characteristics of a second low-pass filter model in the simulation.
Figure 16:
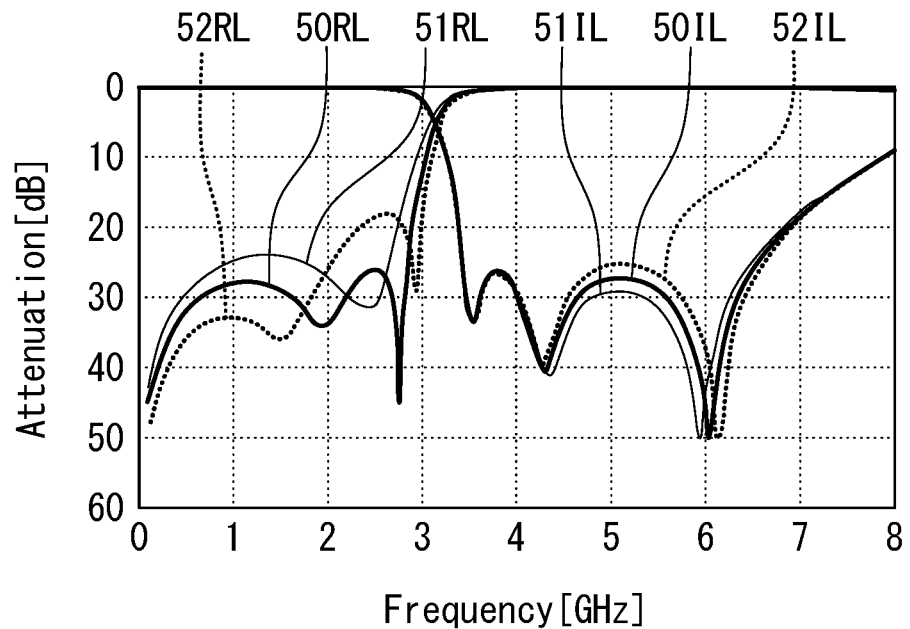
FIG. 16 is a characteristic diagram illustrating the characteristics of a third low-pass filter model in the simulation.
Figure 17:
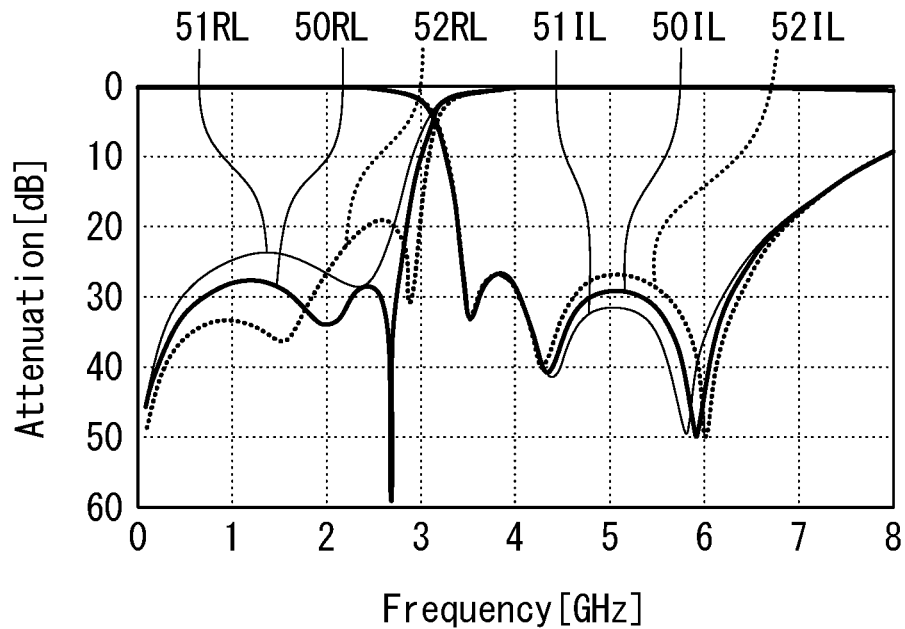
FIG. 17 is a characteristic diagram illustrating the characteristics of a fourth low-pass filter model in the simulation.

FIG. 13 to FIG. 18 illustrate various characteristics obtained by simulation. FIG. 13 illustrates the frequency characteristics of the insertion loss and the return loss of the low-pass filter 101. Hereinafter, the insertion loss and return loss values will be collectively referred to as "attenuation". In FIG. 13 the horizontal axis represents frequency, and the vertical axis represents attenuation. In FIG. 13, the curve 150IL and the curve 150RL respectively represent the frequency characteristics of the insertion loss and the return loss of a basic design.

As shown in FIG. 13, the frequency characteristic of the insertion loss of the low-pass filter 101 shows a plurality of attenuation poles in the stop band. Of the plurality of attenuation poles in the stop band, the attenuation pole occurring at about 6 GHz is due to resonance at a circuit portion composed mainly of the LC series resonators 21R, 22R and 123R.

A method for adjustment of the characteristics of the low-pass filter 101 of the comparative example will be described below. Here, consider a case of designing the low-pass filter 101 to achieve a desired characteristic for each of the frequency characteristic of the insertion loss in the stop band, i.e., the attenuation characteristic, and the frequency characteristic of the return loss in the pass band, i.e., the reflection characteristic. In this case, for characteristic adjustments for the low-pass filter 101 of the comparative example, a basic design is initially implemented to achieve a desired attenuation characteristic. Next, the capacitance of the capacitor C105 is adjusted relative to the basic design to achieve a desired reflection characteristic.

In FIG. 13, the curves 151IL and 151RL represent the frequency characteristics of the insertion loss and the return loss, respectively, when the capacitance of the capacitor C105 is increased by 10% relative to the basic design.

In FIG. 13, the curves 152IL and 152RL represent the frequency characteristics of the insertion loss and the return loss, respectively, when the capacitance of the capacitor C105 is reduced by 10% relative to the basic design.

As shown in FIG. 13, for the low-pass filter 101 of the comparative example, changing the capacitance of the capacitor C105 causes the attenuation characteristic and the reflection characteristic to change simultaneously. The change in the attenuation characteristic is due to a change in the resonance frequency of the resonance at the circuit portion composed mainly of the LC series resonators 21R, 22R and 123R. For the low-pass filter of the comparative example, even if the basic design is implemented to achieve a desired attenuation characteristic, a subsequent adjustment of the capacitance of the capacitor C105 to achieve a desired reflection characteristic may cause the attenuation characteristic to deviate from a desired characteristic. It is thus difficult to adjust the characteristics of the low-pass filter 101 of the comparative example to achieve desired characteristics for both of the attenuation and reflection characteristics.

Next, a method for adjustment of the characteristics of the low-pass filter 1 according to the present embodiment will be described. Here, consider a case of designing the low-pass filter 1 to achieve respective desired characteristics for the attenuation characteristic and the reflection characteristic. In this case, according to the present embodiment, a basic design is initially implemented to achieve a desired attenuation characteristic. Next, the capacitance of the third-path capacitor C5 is adjusted relative to the basic design to achieve a desired reflection characteristic. The reason why such a method is useful in adjusting the characteristics of the low-pass filter 1 in the present embodiment is that changing the capacitance of the third-path capacitor C5 enables changing the reflection characteristic without substantially changing the attenuation characteristic. This will be discussed below with reference to FIG. 14 to FIG. 18.

In the simulation, first to fifth models of the low-pass filter 1 were used to investigate any change in the characteristics of the low-pass filter 1 occurring when changing the capacitance of the capacitor C5. The first model is a model in which the inductance of the third path 23 is zero. The second model is a model in which the inductance of the third path 23 is 10% of the inductance of each of the first and second paths 21 and 22. The third model is a model in which the inductance of the third path 23 is 20% of the inductance of each of the first and second paths 21 and 22. The fourth model is a model in which the inductance of the third path 23 is 30% of the inductance of each of the first and second paths 21 and 22. The fifth model is a model in which the inductance of the third path 23 is 50% of the inductance of each of the first and second paths 21 and 22.

In the simulation, each of the first to fifth models of the low-pass filter 1 was examined for: characteristics obtained with the basic design; characteristics obtained with the capacitance of the capacitor C5 increased by 10% relative to the basic design; and characteristics obtained with the capacitance of the capacitor C5 reduced by 10% relative to the basic design.

FIG. 14 to FIG. 18 illustrate the characteristics of the first to fifth models, respectively. In each of FIG. 14 to FIG. 18, the horizontal axis represents frequency, and the vertical axis represents attenuation. In each of FIG. 14 to FIG. 18, the curves 50IL and 50RL represent the frequency characteristics of the insertion loss and the return loss, respectively, of the basic design; the curves 51IL and 51RL represent the frequency characteristics of the insertion loss and the return loss, respectively, when the capacitance of the capacitor C5 is increased by 10% relative to the basic design; and the curves 52IL and 52RL represent the frequency characteristics of the insertion loss and the return loss, respectively, when the capacitance of the capacitor C5 is reduced by 10% relative to the basic design.

As shown in FIG. 14 to FIG. 18, the frequency characteristic of the insertion loss of each of the first to fifth models shows a plurality of attenuation poles in the stop band. Of the plurality of attenuation poles in the stop band, the attenuation pole occurring at about 6 GHz is due to resonance at a circuit portion composed mainly of the LC series resonators 21R and 22R and the third path 23. When the inductance of the third path 23 is zero, a change in the capacitance of the capacitor C5 does not change or does not substantially change the frequencies at which the aforementioned attenuation poles occur. When the inductance of the third path 23 is higher than zero, a change in the capacitance of the capacitor C5 changes the frequencies at which the aforementioned attenuation poles occur. The magnitude of the changes in the frequencies at which the aforementioned attenuation poles occur in response to the change in the capacitance of the capacitor C5 increases with increasing inductance of the third path 23.

As shown in FIG. 14 to FIG. 17, when the inductance of the third path 23 is 30% or less of the inductance of each of the first and second paths 21 and 22, a change in the capacitance of the capacitor C5 does not substantially change the attenuation characteristic, but greatly changes the reflection characteristic.

Figure 18:
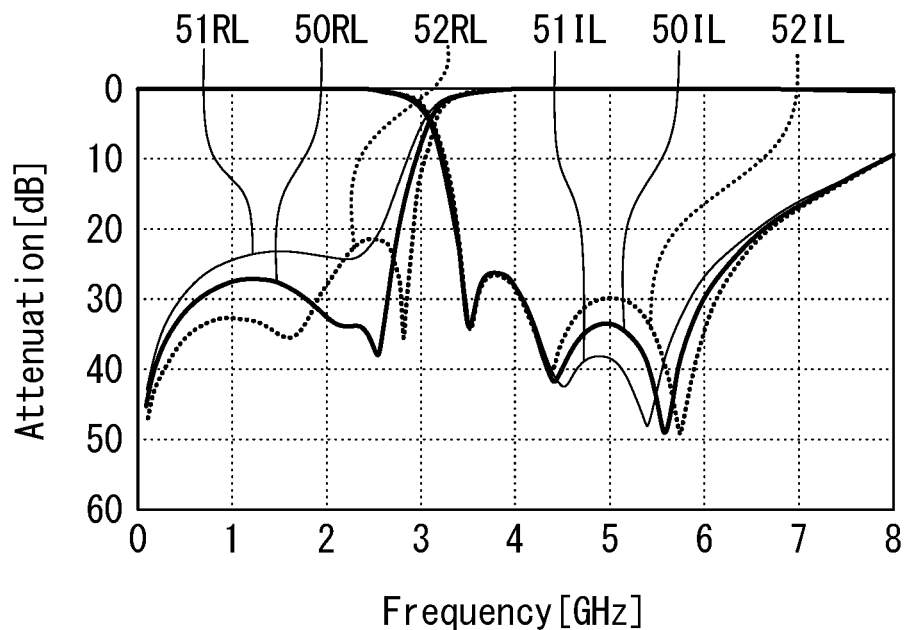
FIG. 18 is a characteristic diagram illustrating the characteristics of a fifth low-pass filter model in the simulation.

As shown in FIG. 18, when the inductance of the third path 23 is 50% of the inductance of each of the first and second paths 21 and 22, a change in the capacitance of the capacitor C5 changes both of the attenuation characteristic and the reflection characteristic, and the change in the attenuation characteristic is smaller than the change in the reflection characteristic. For the fifth model, as shown in FIG. 18, increasing or decreasing the capacitance of the capacitor C5 by 10% relative to the basic design changes the reflection characteristic greatly. In view of this, when actually adjusting the capacitance of the capacitor C5 relative to the basic design so as to achieve a desired reflection characteristic, changing the capacitance of the capacitor C5 by less than 10% relative to the basic design enables changing the reflection characteristic without substantially changing the attenuation characteristic.

The simulation results illustrated in FIG. 14 to FIG. 18 show that, according to the present embodiment, changing the capacitance of the capacitor C5 enables changing the reflection characteristic of the low-pass filter 1 without substantially changing the attenuation characteristic thereof.

The simulation results illustrated in FIG. 14 to FIG. 18 further show that the higher the ratio of the inductance of the third path 23 to the inductance of each of the first and second paths 21 and 22, the greater is the change in the attenuation characteristic when changing the capacitance of the capacitor C5. From the viewpoint of reducing a change in the attenuation characteristic when the capacitance of the capacitor C5 is changed, the inductance of the third path 23 is preferably 30% or less of the inductance of the first path 21 and 30% or less of the inductance of the second path 22.

As described above, according to the present embodiment, changing the capacitance of the capacitor C5 enables changing the reflection characteristic of the low-pass filter 1 without substantially changing the attenuation characteristic thereof. This makes it easy to adjust the characteristics of the low-pass filter 1.

Now, a description will be given of the advantages of the example structure of the low-pass filter 1 shown in FIG. 2 to FIG. 11. In this example, the physical connection C corresponding to the connection point CP, the third-path capacitor C5, and the ground terminal 113 are arranged to intersect or contact the imaginary straight line L extending in the first direction D. This makes it possible to reduce the physical length of the third path 23 from the connection C to the ground terminal 113 to thereby reduce the inductance of the third path 23.

The third-path capacitor C5 includes the first conductor layer 321 and the second conductor layer 341 which are located at different positions in the first direction D and opposed to each other. The physical connection C corresponding to the connection point CP lies in the second conductor layer 341. The third path 23 includes the ground through hole 31T3 having one end connected to the first conductor layer 321 and the other end connected to the ground terminal 113. Such a structure enables a further reduction in the inductance of the third path 23.

The first LC series resonator 21R and the second LC series resonator 22R include the common inductor conductor layer 322 connecting the first- and second-path capacitors C3 and C4 to the one end of the ground through hole 31T3. This allows the inductance of each of the first and second paths 21 and 22 to be higher than the inductance of the third path 23 by at least the inductance of the inductor conductor layer 322.

By virtue of the foregoing, the example structure of the low-pass filter 1 shown in FIG. 2 to FIG. 11 allows the third path 23 to be much lower in inductance than the first and second paths 21 and 22.

Figure 19:
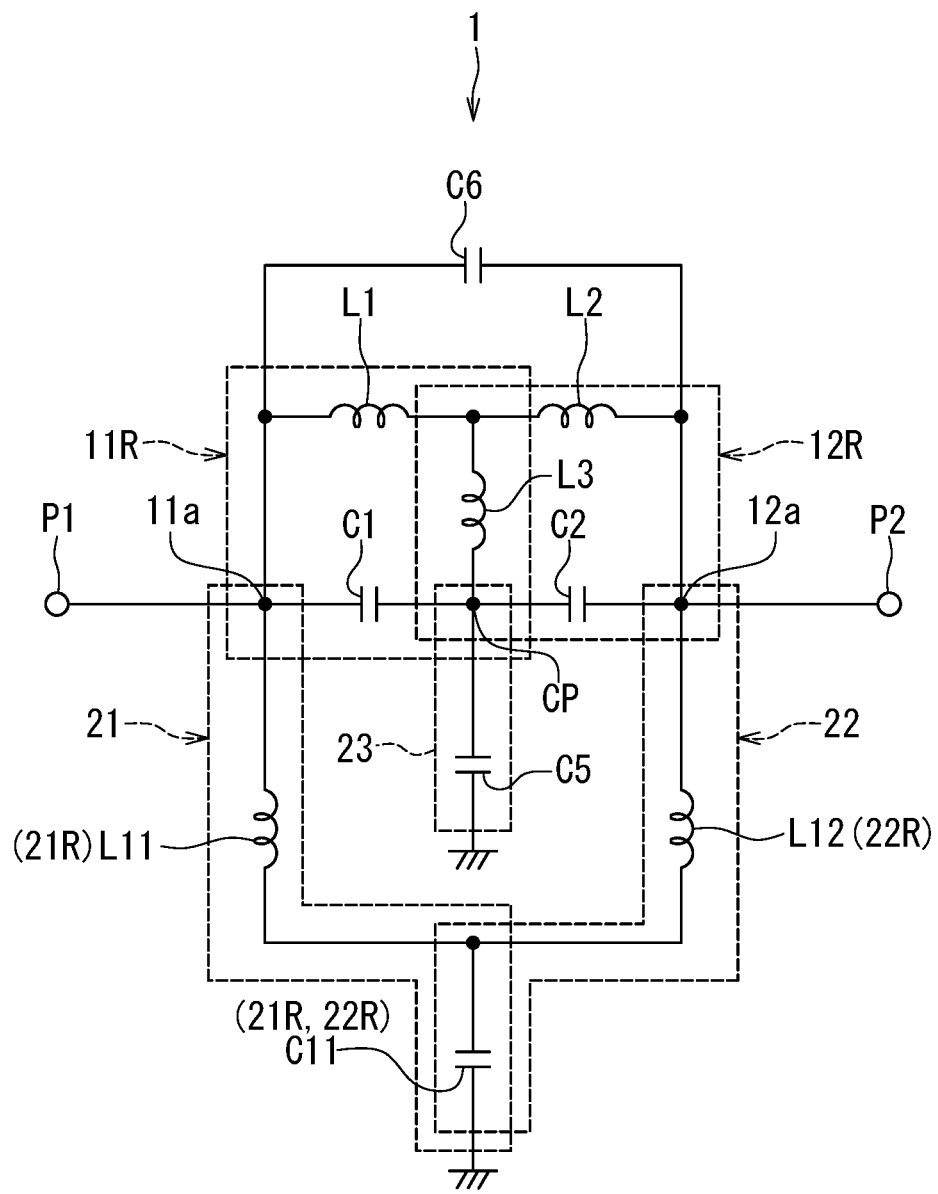
FIG. 19 is a circuit diagram illustrating the circuit configuration of a first modification example of the low-pass filter according to the embodiment of the invention.
Figure 20:
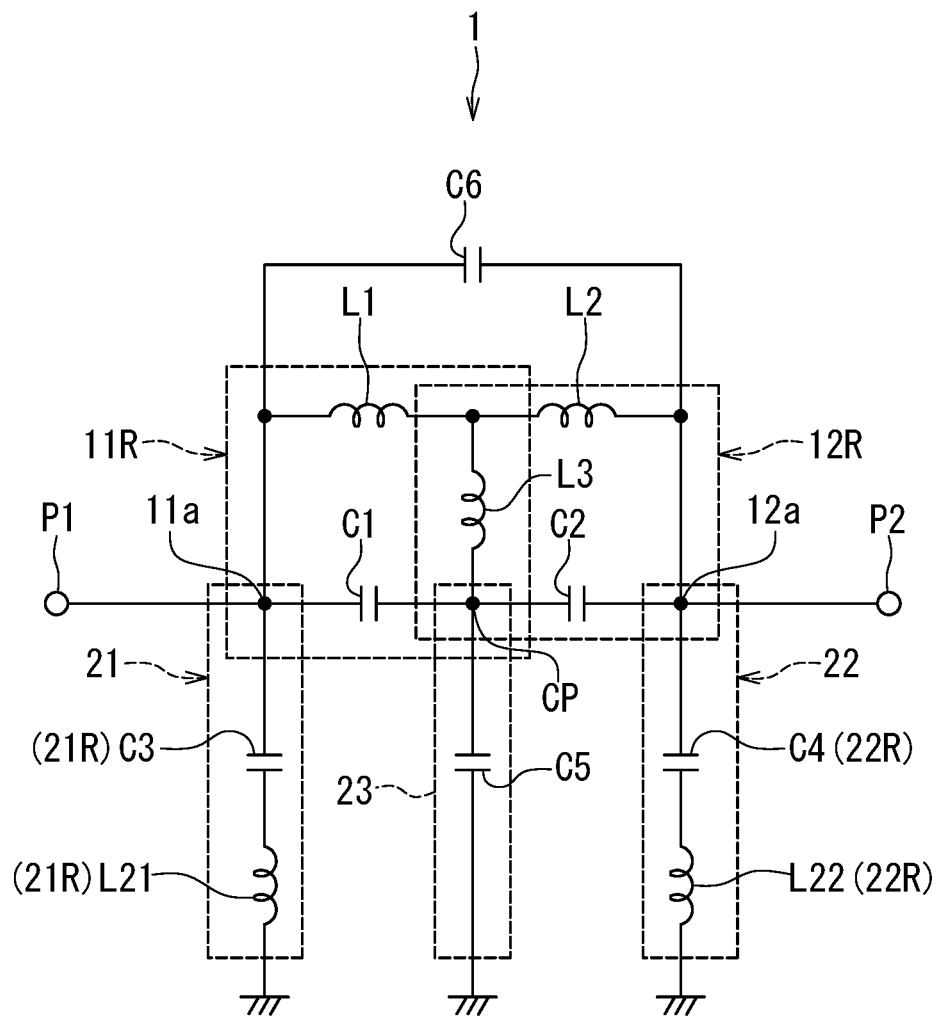
FIG. 20 is a circuit diagram illustrating the circuit configuration of a second modification example of the low-pass filter according to the embodiment of the invention.
Figure 21:
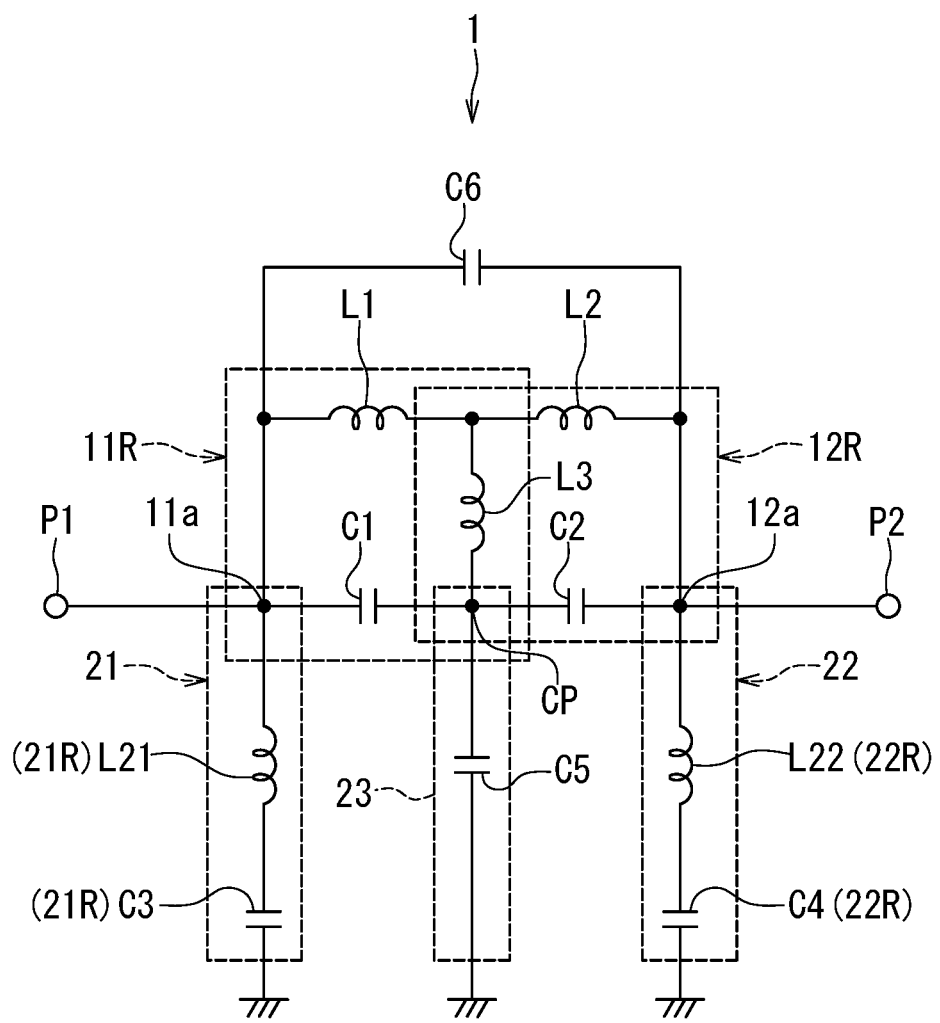
FIG. 21 is a circuit diagram illustrating the circuit configuration of a third modification example of the low-pass filter according to the embodiment of the invention.

Reference is now made to FIG. 19 to FIG. 21 to describe the circuit configuration of a first to a third modification example of the low-pass filter 1 according to the present embodiment.

The circuit configuration of the first modification example shown in FIG. 19 differs from the circuit configuration shown in FIG. 1 in the following ways. In the first modification example, a first-path inductor L11 is provided instead of the first-path capacitor C3, a second-path inductor L12 is provided instead of the second-path capacitor C4, and a capacitor C11 is provided instead of the inductor L4.

In the first modification example, the first LC series resonator 21R includes the inductor L11, the second LC series resonator 22R includes the inductor L12. The first and second LC series resonators 21R and 22R include the common capacitor C11. The inductor L11 and the capacitor C11 are connected in series to constitute the first LC series resonator 21R. The inductor L12 and the capacitor C11 are connected in series to constitute the second LC series resonator 22R.

The circuit configuration of the second modification example shown in FIG. 20 differs from the circuit configuration shown in FIG. 1 in the following ways. In the second modification example, two inductors L21 and L22 are provided instead of the inductor L4. The inductor L21 is provided between the capacitor C3 and the ground. The inductor L22 is provided between the capacitor C4 and the ground. In the second modification example, the first LC series resonator 21R includes the capacitor C3 and the inductor L21 connected in series. The second LC series resonator 22R includes the capacitor C4 and the inductor L22 connected in series.

The circuit configuration of the third modification example shown in FIG. 21 is the same as that of the second modification example except that the relative positions of the capacitor C3 and the inductor L21, and the relative positions of the capacitor C4 and the inductor L22 are inversed from those in the second modification example.

For the first to third modification examples of the low-pass filter 1 also, changing the capacitance of the capacitor C5 enables changing the reflection characteristic without substantially changing the attenuation characteristic.

The present invention is not limited to the foregoing embodiment, and various modifications may be made thereto. For example, the low-pass filter of the present invention can additionally include other components than those recited in claims. For example, the low-pass filter of the present invention can include one or more additional LC parallel resonators connected in series to the first and second LC parallel resonators.

Further, the low-pass filter of the present invention is not limited to one constructed as a single electronic component, and may be a constituent component in an electronic component such as a branching filter including a low-pass filter. In such a case, at least one of the first and second input/output ports may be located within the electronic component.

Further, the characteristics of the low-pass filter of the present invention are not limited to the example characteristics shown in FIG. 14 to FIG. 18.

Obviously, many modifications and variations of the present invention are possible in the light of the above teachings. Thus, it is to be understood that, within the scope of the appended claims and equivalents thereof, the invention may be practiced in other than the foregoing most preferable embodiment.

What is claimed is:

1. A low-pass filter comprising:
a first input/output port;
a second input/output port;
a first LC parallel resonator and a second LC parallel resonator connected in series and provided between the first input/output port and the second input/output port;
a first path;
a second paths; and
a third path, wherein
the first LC parallel resonator has a plurality of ends including a first end, the first end being closest to the first input/output port in circuit configuration as compared to all other ones of the plurality of ends of the first LC parallel resonator,
the second LC parallel resonator has a plurality of ends including a second end, the second end being closest to the second input/output port in circuit configuration as compared to all other ones of the plurality of ends of the second LC parallel resonator,
the first path includes a first LC series resonator and connects the first end to a ground,
the second path includes a second LC series resonator and connects the second end to the ground,
the third path includes a third-path capacitor and connects a connection point between the first and second LC parallel resonators to the ground, and
the third path has an inductance lower than an inductance of each of the first path and the second path, the inductance of the third path being 30% or less of the inductance of the first path and 30% or less of the inductance of the second path.

2. A low-pass filter comprising:
a first input/output port;
a second input/output port;
a first LC parallel resonator and a second LC parallel resonator connected in series and provided between the first input/output port and the second input/output port;
a first path;
a second path; and
a third path, wherein
the first LC parallel resonator has a plurality of ends including a first end, the first end being closest to the first input/output port in circuit configuration as compared to all other ones of the plurality of ends of the first LC parallel resonator,
the second LC parallel resonator has a plurality of ends including a second end, the second end being closest to the second input/output port in circuit configuration as compared to all other ones of the plurality of ends of the second LC parallel resonator,
the first path includes a first LC series resonator and connects the first end to a ground,
the second path includes a second LC series resonator and connects the second end to the ground,
the third path includes a third-path capacitor and connects a connection point between the first and second LC parallel resonators to the ground,
the third path has an inductance lower than an inductance of each of the first path and the second path, and
the first LC series resonator and the second LC series resonator include a common inductor or a common capacitor.

3. A low-pass filter comprising:
a first input/output port;
a second input/output port;
a first LC parallel resonator and a second LC parallel resonator connected in series and provided between the first input/output port and the second input/output port;
a first path;
a second path;
a third path;
a multilayer stack for integrating the first and second input/output ports, the first and second LC parallel resonators and the first to third paths, the multilayer stack including a plurality of dielectric layers stacked to be aligned in a first direction, the multilayer stack having a first end face and a second end face located at opposite ends in the first direction; and
a ground terminal provided on the first end face of the multilayer stack and connected to the third path, wherein
the first LC parallel resonator has a plurality of ends including a first end, the first end being closest to the first input/output port in circuit configuration as compared to all other ones of the plurality of ends of the first LC parallel resonator,
the second LC parallel resonator has a plurality of ends including a second end, the second end being closest to the second input/output port in circuit configuration as compared to all other ones of the plurality of ends of the second LC parallel resonator,
the first path includes a first LC series resonator and connects the first end to a ground,
the second path includes a second LC series resonator and connects the second end to the ground,
the third path include, a third-path capacitor and connects a connection point between the first and second LC parallel resonators to the ground,
the third path has an inductance lower than an inductance of each of the first path and the second path, and
a physical connection corresponding to the connection point between the first and second LC parallel resonators, the third-path capacitor, and the ground terminal are arranged to intersect or contact one imaginary straight line extending in the first direction.

4. The low-pass filter according to claim 3, wherein
the third-path capacitor includes a first conductor layer and a second conductor layer located at different positions in the first direction and opposed to each other,
the physical connection corresponding to the connection point between the first and second LC parallel resonators lies in the second conductor layer, and
the third path further includes a ground through hole having one end connected to the first conductor layer and the other end connected to the ground terminal.

5. The low-pass filter according to claim 4, wherein
the first LC series resonator includes a first-path capacitor,
the second LC series resonator includes a second-path capacitor, and
the first LC series resonator and the second LC series resonator include a common inductor conductor layer connecting the first- and second-path capacitors to the one end of the ground through hole.

\* \* \* \* \*